(12) United States Patent
Miyazawa et al.

(10) Patent No.: US 7,166,954 B2
(45) Date of Patent: Jan. 23, 2007

(54) PIEZOELECTRIC FILM, PIEZOELECTRIC ELEMENT, PIEZOELECTRIC ACTUATOR, PIEZOELECTRIC PUMP, INK-JET TYPE RECORDING HEAD, INK-JET PRINTER SURFACE-ACOUSTIC-WAVE ELEMENT, THIN-FILM PIEZOELECTRIC RESONATOR, FREQUENCY FILTER, OSCILLATOR, ELECTRONIC CIRCUIT, AND ELECTRONIC APPARATUS

(75) Inventors: Hiromu Miyazawa, Toyoshina-machi (JP); Takeshi Kijima, Matsumoto (JP); Takamitsu Higuchi, Matsumoto (JP); Setsuya Iwashita, Nirasaki (JP)

(73) Assignee: Seiko Epson Corporation (JP)

( * ) Notice: Subject to any disclaimer, the term of this patent is extended or adjusted under 35 U.S.C. 154(b) by 259 days.

(21) Appl. No.: 10/980,749

(22) Filed: Nov. 3, 2004

(65) Prior Publication Data

US 2005/0140743 A1    Jun. 30, 2005

(30) Foreign Application Priority Data

Nov. 5, 2003  (JP)  ............................. 2003-375502
Sep. 30, 2004  (JP)  ............................. 2004-287088

(51) Int. Cl.
*H01L 41/187*    (2006.01)
*H03H 9/25*    (2006.01)

(52) U.S. Cl. .......... 310/358; 252/62.9 R; 252/62.9 PZ; 501/134; 310/313 R

(58) Field of Classification Search .......... 252/62.9 R, 252/62.9 PZ; 310/358; 501/134
See application file for complete search history.

(56) References Cited

FOREIGN PATENT DOCUMENTS

| EP | 476703 A1 | * | 3/1992 |
| JP | 03083859 A | * | 4/1991 |
| JP | 2001-223404 | | 8/2001 |
| JP | 2003063865 A | * | 3/2003 |
| JP | 2003267796 A | * | 9/2003 |

\* cited by examiner

*Primary Examiner*—Darren Schuberg
*Assistant Examiner*—J. Aguirrechea
(74) *Attorney, Agent, or Firm*—Harness, Dickey & Pierce, P.L.C.

(57) ABSTRACT

A piezoelectric film is provided that is represented by the following general formula: $Pb_{1-b}[((X_{1/3}Nb_{2/3})_{1-c}B'_{c})_{1-a}Y_{a}]O_{3}$ wherein X is at least one of Mg, Zn and Ni; B' is at least one of Zr, Ti and Hf; Y is at least one of V, Nb, Ta, Cr, Mo and W; a satisfies $0.05 \leq a < 0.30$; b satisfies $0.025 \leq b \leq 0.15$; when X is Mg, c satisfies $0.25 \leq c \leq 0.35$; when X is Ni, c satisfies $0.30 \leq c \leq 0.40$; and when X is Zn, c satisfies $0.05 \leq c \leq 0.15$.

21 Claims, 12 Drawing Sheets

PIEZOELECTRIC FILM, PIEZOELECTRIC ELEMENT, PIEZOELECTRIC ACTUATOR, PIEZOELECTRIC PUMP, INK-JET TYPE RECORDING HEAD, INK-JET PRINTER SURFACE-ACOUSTIC-WAVE ELEMENT, THIN-FILM PIEZOELECTRIC RESONATOR, FREQUENCY FILTER, OSCILLATOR, ELECTRONIC CIRCUIT, AND ELECTRONIC APPARATUS

RELATED APPLICATIONS

This application claims priority to Japanese Patent Application Nos. 2003-375502 filed Nov. 5, 2003 and 2004-287088 filed Sep. 30, 2004 which are hereby expressly incorporated by reference herein in their entirety.

BACKGROUND

1. Technical Field

The present invention relates to a piezoelectric film, a piezoelectric element, a piezoelectric actuator, a piezoelectric pump, an ink-jet type recording head, an ink-jet printer, a surface-acoustic-wave element, a thin-film piezoelectric resonator, a frequency filter, an oscillator, an electronic circuit and an electronic apparatus.

2. Related Art

As a printer which allows high-quality and high-speed printing, an ink-jet printer has been widely known. An ink-jet printer has an ink-jet type recording head having cavities whose internal volume varies and performs printing by discharging ink drops from nozzles while the head moves to scan. Conventionally, as a head actuator in an ink-jet type recording head for such an ink-jet printer, a piezoelectric element using a piezoelectric film which is represented by PZT ($Pb(Zr, Ti)O_3$) is used (for example, see Japanese Unexamined Patent Application Publication No 2001-223404). As the piezoelectric constant of a piezoelectric film gets higher, the pitch of nozzles of the ink-jet recording head can be decreased to realize high-density arrangement of the nozzles, and the printing speed can be increased.

Further, in a surface-acoustic-wave element, a frequency filter, an oscillator, an electronic circuit and the like, since the performance enhancement has been required, there is a need to provide a novel piezoelectric material by which high-quality goods can be manufactured.

An object of the present invention is to provide a piezoelectric film having good piezoelectric properties. Another object of the present invention is to provide a piezoelectric element using the piezoelectric film and to provide, using the piezoelectric element, a piezoelectric actuator, a piezoelectric pump, an ink-jet type recording head, an ink-jet printer, a surface-acoustic-wave element, a thin-film piezoelectric resonator, a frequency filter, an oscillator, an electronic circuit and an electronic apparatus.

SUMMARY

A first piezoelectric film according to the present invention is represented by the following general formula: $Pb_{1-b}[((X_{1/3}Nb_{2/3})_{1-c}B'_c)_{1-a}Y_a]O_3$ wherein X is at least one of Mg, Zn and Ni; B' is at least one of Zr, Ti and Hf; Y is at least one of V, Nb, Ta, Cr, Mo and W; a satisfies $0.05 \leq a < 0.30$; b satisfies $0.025 \leq b \leq 0.15$; when X is Mg, c satisfies $0.25 \leq c \leq 0.35$; when X is Ni, c satisfies $0.30 \leq c \leq 0.40$; and when X is Zn, c satisfies $0.05 \leq c \leq 0.15$.

According to the piezoelectric film related to the present invention, a composition which is equivalent to B site of a perovskite structure represented by $ABO_3$ and is represented by $(X_{1/3}Nb_{2/3})_{1-c}B'_c$, is partially substituted with an element Y which has a higher valence than that of the composition, so that the crystal structure can keep neutral as a whole, thereby enhancing its insulating properties.

According to the present invention, in the composition which is represented by $(X_{1/3}Nb_{2/3})_{1-c}B'_c$, the valence of the element X is 2, the valence of the element Nb is 5, and the valence of the element B' is 4. Thus, the valence of the whole composition concerned is 4. Accordingly, the valence of the element Y which has a higher valence than of the composition is 5 or more. In the present invention, the valence of the element Y is 5 or 6. This is also true of general formulas, which will be described below.

In the present invention, the range of the composition ratio of each element shown in the above general formula is not strictly limited thereto, and can have a deviation to the extent that desired properties can be acquired or a deviation due to a measurement error. This is also true of general formulas which will be described below.

A second piezoelectric film according to the present invention is represented by the following general formula: $Pb_{1-b-d}[((X_{1/3}Nb_{2/3})_{1-c}B'_c)_{1-a}Y_a]O_{3-d}$ wherein X is at least one of Mg, Zn and Ni; B' is at least one of Zr, Ti and Hf; Y is at least one of V, Nb, Ta, Cr, Mo and W; a satisfies $0.05 \leq a < 0.30$; b satisfies $0.05 \leq b \leq 0.15$; d satisfies $0 < d \leq 0.03$; when X is Mg and Ni, c satisfies $0.20 \leq c \leq 0.45$, and when X is Zn, c satisfies $0.5 \leq c \leq 0.20$.

According to the piezoelectric film related to the present invention, similar to the first piezoelectric film, a composition which is equivalent to B site of a perovskite structure represented by $ABO_3$ and is represented by $(X_{1/3}Nb_{2/3})_{1-c}B'_c$, is partially substituted with an element Y which has a higher valence than that of the composition, so that, even if the Pb located at A site suffers a loss, the crystal structure can keep neutral as a whole without the deficiency of oxygen, thereby enhancing its insulating properties.

In the compositions of the first and second piezoelectric films represented by the general formulas, preferably, Pb can be partially substituted with at least one element whose valence is higher than that of Pb. As the elements concerned, lanthanoids having a valence of +3 or more can be exemplified.

In the piezoelectric film according to the present invention, preferably, the piezoelectric film has a rhombo-hedral structure and has preferred (100) orientation in a pseudo-cubic crystal system.

According to the present invention, what the term of "preferred orientation" means includes the case when 100% of crystals has are desired (100) orientation and the case when most of crystals (for example, 90% of crystals) has desired (100) orientation and the remaining crystals has other orientations (for example, (111) orientation).

Further, in the present invention, the "preferred (100) orientation in a pseudo-cubic crystal system" means preferred (100) orientation when shown in a pseudo-cubic crystal system. This is not limited to (100) orientation in a pseudo-cubic crystal system, but is also applicable to, for example, (111) orientation in a pseudo-cubic crystal system.

In the piezoelectric film according to the present invention, preferably, an element indicated by Y is at least one of elements, V, Nb and Ta whose valence is 5, and the deficient amount b of Pb is almost half of the amount a of Y.

In the piezoelectric film according to the present invention, preferably, an element indicated by Y is at least one of elements, Cr, Mo and W whose valence is 6, and the deficient amount b of Pb is almost the same as the amount a of Y.

In the piezoelectric film according to the present invention, preferably, Y includes Y1 and Y2; the composition ratio of Y1 and Y2 is represented by (a−e):e; Y1 is at least one of V, Nb and Ta; Y2 is at least one of Cr, Mo and W; and the deficient amount b of Pb is almost the same as the total amount of (a−e)/2, which is a half of the amount of Y1, and the amount e of Y2.

In the piezoelectric film according to the present invention, preferably, B' is Ti.

In the piezoelectric film according to the present invention, preferably, in B', the composition ratio of at least one of Zr and Hf to Ti is represented by (1−p):p; and p satisfies $0.6 \leq p$.

A piezoelectric element according to the present invention may include the above-mentioned piezoelectric film according to the present invention.

A piezoelectric element according to the present invention may further include a lower electrode formed on a substrate, the piezoelectric film being formed on the lower electrode; and an upper electrode formed on the piezoelectric film.

In the present invention, that one thing (hereinafter, referred to as "A") formed on another thing (hereinafter, referred to as "B") should be construed to include the "A" which is directly formed right on the "B" and the "A" formed on the "B" with a third thing interposed between them. Further, in the present invention, that "A" is formed on "B" should be construed to include both a case in which the "A" is directly formed right on the "B" and a case in which the "A" is formed on the "B" with a third thing interposed between them.

In the piezoelectric element according to the present invention, the element may further include a buffer layer formed on the substrate by an ion-beam assisted method; a lower electrode of a perovskite structure formed on the buffer layer, the piezoelectric film being formed on the lower electrode; and an upper electrode formed on the piezoelectric film.

In the piezoelectric element according to the present invention, the lower electrode has preferred (100) orientation in a pseudo-cubic crystal system by epitaxial growth.

In the piezoelectric element according to the present invention, preferably, the lower electrode is at least one of $SrRuO_3$, Nb—$SrTiO_3$, La—$SrTiO_3$, and (La, Sr)$CoO_3$.

A piezoelectric actuator according to the present invention may employ the above-mentioned piezoelectric element.

A piezoelectric pump according to the present invention may employ the above-mentioned piezoelectric element.

An ink-jet type recording head according to the present invention may employ the above-mentioned piezoelectric element.

An ink-jet printer according to the present invention may employ the above-mentioned ink-jet type recording head.

A surface-acoustic-wave element according to the present invention may employ the above-mentioned piezoelectric element.

A thin-film piezoelectric resonator according to the present invention may employ the above-mentioned piezoelectric element.

A frequency filter according to the present invention may employ at least one of the above-mentioned surface-acoustic-wave element and the above-mentioned thin-film piezoelectric resonator.

An oscillator according to the present invention may employ at least one of the above-mentioned surface-acoustic-wave element and the above-mentioned thin-film piezoelectric resonator.

An electronic circuit according to the present invention may employ at least one of the above-mentioned frequency filter and the above-mentioned oscillator.

An electronic apparatus according to the present invention can employ at least one of the above-mentioned piezoelectric pump and the above-mentioned electronic circuit.

DETAILED DESCRIPTION

Hereinafter, preferred embodiments of the present invention will be described with reference to the accompanying drawings.

1. First Embodiment 1-1. Piezoelectric Film and Piezoelectric Element

Figure 1:
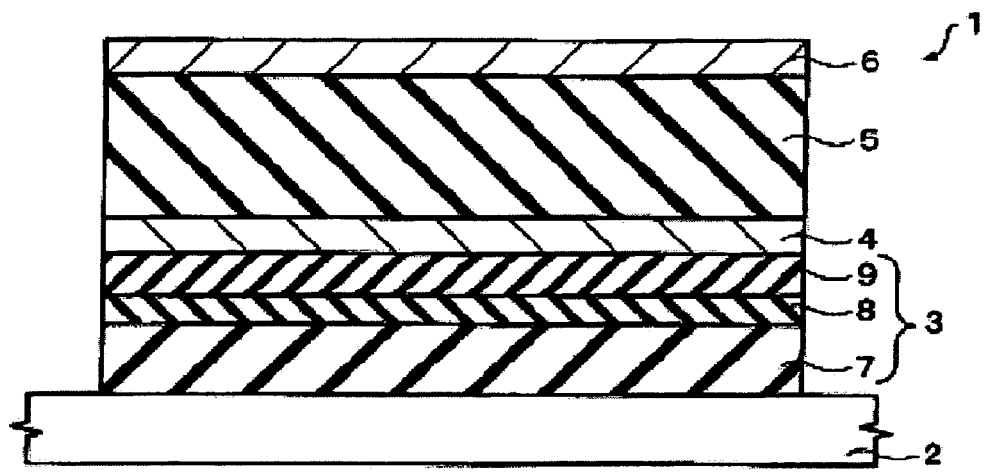
FIG. 1 is a sectional view of a piezoelectric element according to a first embodiment of the present invention.

FIG. 1 shows a first embodiment of the present invention, especially, when a piezoelectric element 1 of this invention is applied to a piezoelectric element 1 which serves as a head actuator for an ink-jet type recording head.

This piezoelectric element 1 includes a buffer layer 3 formed on a substrate 2, a lower electrode 4 formed on the buffer layer 3, a piezoelectric film 5 formed on the lower electrode 4, and an upper electrode 6 formed on the piezoelectric film 5.

For a substrate 2, a silicone substrate can be employed. In this embodiment, a substrate using a plane (110) of silicon crystal is used as the surface of the substrate 2. By being machined, a substrate 2 is formed with ink cavities in the ink-jet type recording head 50 as will be described. Further, the buffer layer 3 functions as an elastic film in the ink-jet type recording head 50.

For a buffer layer 3, although a buffer layer with single-way orientation (whose orientations are arranged only in the thickness direction) is preferable, what is oriented in plane (whose orientations are arranged over all the three dimensions) is much preferable. By forming such a buffer layer 3, the good bonding property (adhesion property) can be obtained between the substrate 2, such as a silicon substrate on which a natural oxidization layer was formed, and a lower electrode 4 which will be mentioned later.

In addition, it is preferable that the buffer layer 3 includes at least one of a metallic oxide of an NaCl structure, a metallic oxide of a fluorite structure, a metallic oxide of a perovskite structure and the like. Particularly, it is preferable that the buffer layer has a laminated structure of a metallic oxide of an NaCl structure or a metallic oxide of a fluorite structure and, and a metallic oxide of a perovskite structure. Lattice mismatch between a metallic oxide of an NaCl structure or a metallic oxide of a fluorite structure and a metallic oxide having a perovskite structure is small. Thus, when a lower electrode of a perovskite structure is formed as the lower electrode 4 as will be described below, it is advantageous to employ a perovskite structure as a layer thereunder.

According to this embodiment, the buffer layer 3 is comprised of a first buffer layer 7 and a second buffer layer 8 each of which is made of a metallic oxide of an NaCl structure or a metallic oxide of a fluorite structure and, a third buffer layer 9, formed on the second buffer layer 8, which is made of a metallic oxide having a perovskite structure.

The first buffer layer 7 can be formed by, for example, an ion-beam assisted method. For example, an yttria stabilized zirconia (hereinafter, referred to as "YSZ") having (100) orientation in a cubic crystal system can be used for the first buffer layer 7. As the YSZ, what is represented by the following formulas can be optionally used:

$0 \leq x \leq 1.0$ (Ln: Y, La, Ce, Pr, Nd, Sm, Eu, Gd, Tb, Dy, Ho, Er, Tm, Yb, Lu).

The thickness of the first buffer layer 7 can be made to be large as, for example, about 1 μm. The reason why the first buffer layer 7 is formed thickly is to make the first buffer layer 7 function as an etching stopper layer when ink cavities are formed in the substrate 2 by etching as will be described below. Further, since the first buffer layer 7 is formed thickly in this way, it is possible to make the first buffer layer 7 substantially function as an elastic film when making the buffer layer 3 function as an elastic film in an ink-jet type recording head 50.

The first buffer layer 7 is directly formed on the substrate 2. However, usually, a natural oxide (silicon dioxide) film is formed on the substrate 2 comprised of a silicon substrate. Since it is difficult to epitaxially grow YSZ on the natural oxide film using a general growth method, in this embodiment of the present invention, an ion-beam assisted method, as will be described below, is employed to obtain an epitaxially grown first buffer layer 7. In addition, the natural oxide film formed on the substrate 2 may be an amorphous film.

For the second buffer layer 8, for example, $CeO_2$ having (100) orientation in a cubic crystal system can be used. What is epitaxially grown on the first buffer layer 7 can be used as the second buffer layer 8. The thickness of the second buffer layer 8 is, for example, about 100 nm.

In addition, the material for the first buffer layer 7 and the second buffer layer 8 is not limited to YSZ or $CeO_2$, and a metallic oxide of an NaCl structure or a metallic oxide of a fluorite structure can be used. As the metallic oxide of an NaCl structure, MgO, CaO, SrO, BaO, MnO, FeO, CoO, NiO, or a solid solution containing them can be exemplified. Among them, it is preferable to use at least one of, particularly, MgO, CaO, SrO, BaO and a solid solution containing them. Such a metallic oxide of an NaCl structure has especially small lattice mismatch with a metallic oxide having a perovskite structure.

As the metallic oxide of a fluorite structure, YSZ, $CeO_2$, $ZrO_2$, $ThO_2$, $UO_2$, or a solid solution containing them can be exemplified. Among them, it is preferable to use at least one of, particularly, YSZ, $CeO_2$, $ZrO_2$, and a solid solution containing them. Such a metallic oxide of a fluorite structure also has especially small lattice mismatch with a metallic oxide having a perovskite structure.

As the third buffer layer 9, $YBa_2Cu_3O_x$ (x is, for example, 7) which is a stratified perovskite oxide, for example, can be used. What is epitaxially grown on the second buffer layer 8 with (001) orientation in an orthorhombic crystal system can be used for the third buffer layer 9. The thickness of the third buffer layer 9 is, for example, about 30 nm. By using for the third buffer layer 9 a metallic oxide having a perovskite structure, lattice mismatch between the third buffer layer 9 and such a second buffer layer 8 as previously described becomes especially small. Therefore, it is possible to obtain a good crystal structure having no defect and to make a perovskite-type lower electrode 4 epitaxially grown on the third buffer layer 9.

In addition, the material for the third buffer layer 9 is not limited to $YBa_2Cu_3O_x$, and other perovskite-type metallic oxides can be used. For example, $CaRuO_3$, $SrRuO_3$, $BaRuO_3$, $SrVO_3$, (La, Sr)$MnO_3$, (La, Sr)$CrO_3$, (La, Sr)$CoO_3$, or a solid solution containing them can also be used.

The lower electrode 4 is made of a perovskite-type metallic oxide, similar to the third buffer layer 9, and has preferred (100) orientation in a pseudo-cubic crystal system by an epitaxial growth method. The thickness of the lower electrode 4 is, for example, about 50 nm. As the perovskite-type metallic oxides for forming the lower electrode 4, metallic oxides usable for the third buffer layer 9 can be used as they are, and particularly, at least one of $SrRuO_3$, Nb—$SrTiO_3$, La—$SrTiO_3$, and (La, Sr)$CoO_3$ can be properly used. Here, Nb—$SrTiO_3$ is obtained by doping $SrTiO_3$ with Nb, and La—$SrTiO_3$ is obtained by doping $SrTiO_3$ with La. Since these metallic oxides have excellent electroconductivity and chemical stability, the lower electrode 4 formed of the metallic oxides also has excellent electroconductivity and chemical stability. Further, the piezoelectric film 5 having a rhombo-hedral structure and preferred (100) orientation in a pseudo-cubic crystal system can be satisfactorily formed thereon. In addition, in this embodiment, $SrRuO_3$ with preferred (100) orientation in a pseudo-cubic crystal system is used as the lower electrode 4.

The piezoelectric film 5 is made of a relaxer-based material having a perovskite-type crystal structure. Specifically, the piezoelectric film 5 is represented by the following general formula (1):

$$Pb_{1-b}[((X_{1/3}Nb_{2/3})_{1-c}B'_c)_{1-a}Y_a]O_3.$$

Here, X is at least one of Mg, Zn and Ni, B' is at least one of Zr, Ti and Hf, Y is at least one of V, Nb, Ta, Cr, Mo and W, a satisfies $0.05 \leq a < 0.30$ b satisfies $0.025 \leq b \leq 0.15$, when X is Mg, preferably, c satisfies $0.25 \leq c \leq 0.35$, when X is Ni, preferably, c satisfies $0.30 \leq c \leq 0.40$, and when X is Zn, preferably, c satisfies $0.05 \leq c \leq 0.15$.

If the above conditions are satisfied, the piezoelectric film 5 can be easily controlled to have a rhombo-hedral structure, thereby exhibiting high piezoelectric properties. Hereinafter, the composition expressed by the general formula (1) may be represented by "PXNB'Y".

Figure 2:
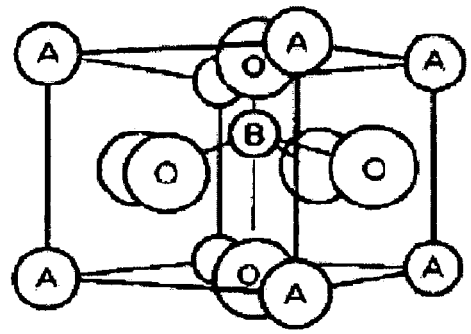
FIG. 2 is an explanatory view of a perovskite crystal structure.
Figure 3:
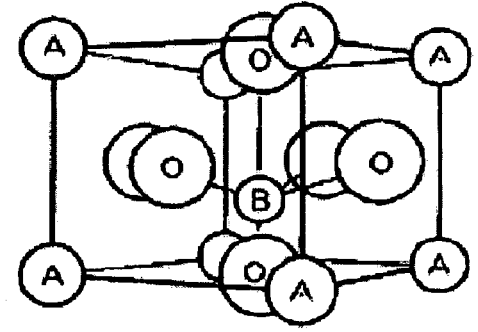
FIG. 3 is an explanatory view of a perovskite crystal structure.

The perovskite type has a crystal structure as shown in FIGS. 2 and 3, and the sites represented by "A" and "B" in FIGS. 2 and 3 are respectively referred to as "A" site and "B" site. For example, in PXNB'Y represented by the general formula (1), Pb is located at A site, and X, Nb (niobium), B' and Y are located at B site. Further, O (oxygen) is located at the site represented by "O" in FIGS. 2 and 3.

A metallic element whose valence is higher than the total valence of the composition represented by $((X_{1/3}Nb_{2/3})_{1-c}B'_c)$, i.e., +4 can be employed as the "Y". As a metallic element whose valence is higher than +4, there are, for example, V (+5), Nb (+5), Ta (+5), Cr (+6), Mo (+6), W (+6) and the like.

In the material having a perovskite crystal structure of Pb system, for example, PZT, the relaxer material of the present invention, and the like, Pb located on the "A" site of the perovskite structure tends to be easily vaporized during a thin-film forming process because the vapor pressure of Pb is high. When Pb suffers a loss, oxygens surfer a loss in pairs to reduce the energy of a system. When the Schottky defect is represented by a composition formula in connection with the relaxer material, the composition formula becomes $Pb_{1-b}(X_{1/3}Nb_{2/3})_{1-c}B'_cO_{3-b}$.

When oxygens suffer a loss, the band gap of a system is narrowed because the electrostatic potential of transition metal ions located at B sites approximate to each other is reduced. Therefore, the band offset in the electrode interface decreases, and the insulation property of the piezoelectric film 5 made of the relaxer material deteriorates.

Further, the oxygen deficiency causes oxygen ion conduction. That is, oxygen ions are diffused along the direction of the oxygen deficiency of an oxygen octahedron in a perovskite structure. The oxygen ions are ultimately accumulated in the electrode surface to form fixed charges, which causes deterioration of the piezoelectric properties of a system.

Accordingly, an objective to realize the piezoelectric film 5 having high reliability using the relaxer material results in a problem how to suppress the oxygen deficiency while allowing the evaporation of Pb.

Thus, according to the present invention, by replacing the "Y" whose valence is higher than that of the composition represented by $((X_{1/3}Nb_{2/3})_{1-c}B'_c)$ with an element (X, Nb, or B') located at B site, it is possible to keep the crystal structure neutral as a whole without suffering oxygen deficiency even though the deficiency of Pb occurs. As a result, the insulation property of the piezoelectric film 5 is improved and the current leak and the diffusion of oxygen ions can be prevented.

For example, when Nb is used as an atom represented by Y, since the size of Nb is almost the same as that of Ti (the ion radius is nearly the same) and the weight of Nb is twice as much as that of Ti, it is difficult for an atom to escape from a lattice even by the collision between atoms due to lattice vibration. Moreover, Nb forms a significantly strong covalent bond with oxygen and it is expected to enhance the ferroelectric properties shown by Curie temperature, polarization moment and the like and the piezoelectric properties shown by a piezoelectric constant and the like (H. Miyazawa, E. Natori, S. Miyashita; Jpn. J. Appl. Phys. 39 (2000) 5679). In addition, although the case when Y is Nb is exemplified above, even when Y is at least one of V, Ta, Cr, Mo, and W, an equivalent effect thereto is expected.

When Y is an element whose valence is +5, the amount "a" of Y is preferable to satisfy $0.05 \leq a < 0.30$. In this case, the deficient amount "b" of Pb is preferable to be a half of the amount "a" of Y. That is, in order to maintain the band gap of a system, it is preferable that the deficient amount "b" of Pb required by an ion model is represented by $b < a/2$ and is in a range of $0.025 \leq b \leq 0.15$. In addition, actually, the range of "a" and "b" is related to a measurement error, etc. This is true of all the numerical limitations which will be given below.

The numerical limitation mentioned above has the following meaning. When the amount "a" of Y is less than 0.05, the current leak preventing effect due to the addition of Y is not so good, whereas when the amount "a" of Y is over 0.30, the crystallinity suffers deterioration, thereby rapidly deteriorating the piezoelectric properties. As an Y whose valence is +5, for example, V, Nb, Ta and the like can be exemplified. Among them, Nb and Ta are preferable and Nb is more preferable because it easily and stably forms a perovskite structure and its ion radius is approximate to that of Ti.

When Y is an element whose valence is +6, the additive amount "a" of Y preferably satisfies $0.05 \leq a \leq 0.15$. In this case, the deficient amount "b" of Pb is preferable to be almost the same as the amount "a" of Y. That is, in order to maintain the band gap of a system, it is preferable that the deficient amount "b" of Pb required by an ion model is represented by $b \leq a$ and is in a range of $0.05 \leq b \leq 0.15$.

When the amount "a" of Y is less than 0.05, the current leak preventing effect due to the addition of Y is not so good, whereas even when the amount "a" of Y is over 0.15, the further improvement of the current leak preventing effect cannot be expected. As a result, Y is an element whose valence is +6, for example, Cr, Mo, W and the like can be exemplified.

When Y includes elements of Y1 (+5) and Y2 (+6), the general formula of PXNB'Y is represented by $Pb_{1-b}[((X_{1/3}Nb_{2/3})_{1-c}B'_c)Y1_{a-e}Y2_eO_3]$. (a-e) is the amount of Y1 and "e" is the amount of Y2. In this case, it is preferable that the amount "(a-e)" of Y1 and the amount "e" of Y2 is in a range of $0.05 \leq (a-e)/2 + e \leq 0.15$. In this case, in order to maintain the band gap of a system, it is preferable that the deficient amount "b" of Pb required by an ion model is almost the same as the total amount of (a-e)/2, which is a half of the amount of Y1, and the additive amount e of Y2. That is, it is preferable that the deficient amount "b" of Pb is represented by $b \leq (a-e)/2 + e$, and is in a range of $0.05 \leq b \leq 0.15$.

When the total amount (a-e)/2+e (hereinafter, referred to as "total amount f") of a half, i.e., (a-e)/2 of the amount of Y1 and the amount "e" of Y2, is less than 0.05, the current leak preventing effect due to addition is not so good, whereas when the total amount f is over 0.15, the crystallinity suffers deterioration, thereby deteriorating the piezoelectric properties. A preferable element as Y1 is Nb and a preferable element as Y2 is Mo or W.

As described above, when X is Mg, "c" preferably satisfies $0.25 \leq c \leq 0.35$, when X is Ni, "c" preferably satisfies $0.30 \leq c \leq 0.40$, and when X is Zn, "c" preferably satisfies $0.05 \leq c \leq 0.15$.

When the value of "c" in a phase boundary (MPB: Morphotropic Phase Boundary) of the crystal structure of the piezoelectric film 5 is referred to as "$c_{MPB}$", it is preferable that the range of "c" as a piezoelectric substance is smaller than $c_{MPB}$ and further around $c_{MPB}$. If the value of "c" is smaller than $c_{MPB}$, the crystal structure of the piezoelectric film 5 becomes a rhombo-hedral structure, and further the piezoelectric constant ($d_{31}$) around $c_{MPB}$ has a maximum value.

Accordingly, when X is Mg, since CMPB is around 0.35, "c" is preferable to be less than 0.35. Further, when X is Zn, since CMPB is around 0.1, "c" is preferable to be less than 0.1. Furthermore, when X is Ni, since $c_{MPB}$ is around 0.40, "c" is preferable to be less than 0.40.

Further, a value near to the value ($c_{MPB}$) of c at the phase boundary is chosen as the lower limit of c. As a range of c suitable for carrying out this invention, a comparatively small value is allowable, but in order to get a higher piezoelectric constant ($d_{31}$), a value which is nearer to the preferable value of c, i.e., the value ("$c_{MPB}$") of c at the phase boundary is selected. Accordingly, the lower limit of c is the value of c at the time of the piezoelectric constant ($d_{31}$) becoming the allowable lower limit when the piezoelectric element 1 operates.

When the above-described contents are represented by formulas, for example, "c" can satisfy $(c_{MPB}-0.1) \leq c \leq C_{MPB}$, and preferably, "c" can satisfy $(c_{MPB}-0.05) \leq c \leq c_{MPB}$.

In addition, since CMPB in a thin film may be varied depending on film forming conditions, film stress and the like, $c_{MPB}$ is not limited particularly, and it can be varied in an allowable range of about ±0.05.

The piezoelectric film 5 has a rhombo-hedral structure and has preferred (100) orientation in a pseudo-cubic crystal system. This piezoelectric film 5 which has a rhombo-hedral structure and has preferred (100) orientation in a pseudo-cubic crystal system can be obtained, particularly, by adjusting film forming conditions such as temperature. Alternatively, the buffer layer 3 that is a lower structure of the piezoelectric film 5 is formed using the ion-beam assisted method as in the present invention, so that the piezoelectric film 5 which has a rhombo-hedral structure and has preferred (100) orientation in a pseudo-cubic crystal system can be obtained. The thickness of the piezoelectric film 5 is, for example, about 500 to 1500 nm.

In addition, the above-mentioned piezoelectric film 5 is represented by the composition formula $Pb_{1-b}[(X_{1/3}/Nb_{2/3})_{1-c}B'_c]_{1-a}Y_a]O_3$, and O (oxygen) is not subject to loss. However, it is also possible to extract oxygen. In that case, the general formula becomes $Pb_{1-b-d}[(X_{1/3}/Nb_{2/3})_{1-c}B'_c]_{1-a}Y_a]O_{3-d}$. In this case, it is preferable that the deficient amount "d" of oxygen is in a range of $0 < d \leq 0.03$. It is preferable that the deficient amount "d" of oxygen is near zero as much as possible because the diffusion of oxygen ions is suppressed.

Further, Pb located on A site in the perovskite structure of the piezoelectric film 5 can also be replaced in part with the element Z whose valence is higher than that of Pb (+2). That is, in this case, the general formula of the piezoelectric film 5 is $(Pb_{1-g}Z_g)_{1-b}[((X_{1/3}/Nb_{2/3})_{1-c}B'_c)_{1-a}Y_a]O_3$. In this case, it is preferable that the amount "g" of Z is in a range of $0 \leq g \leq 0.05$. Further, if the value of g is over 0.05, the covalent bond with oxygen is high and the amount of Pb decreases. Therefore, the piezoelectric properties deteriorate, which is not preferable. For Z, for example, lanthanoids are preferable such as La, Ce, Pr, Nd, Pm, Sm, Eu, Gd, Tb, Dy, Ho, Er, Tm, Yb, and Lu, etc., and more preferably, La, Pr, Nd, and Sm each of which has an valence of +3. Since it is considered that the lanthanoids have almost the same ion radius than that of Pb, it is considered that the lanthanoids do not damage the perovskite structure when entering the A site.

B' consists of at least one of Zr, Ti and Hf. When B' consists of only Ti among them, the piezoelectric property becomes the highest.

Further, B' may include at least one of Zr and Hf, and Ti. In this case, when B' includes at least one of Zr and Hf other than Ti, occurrence of crack during film formation can be prevented. However, when the amount of Ti having a higher covalent bond with oxygen than Zr and Hf, the piezoelectric properties deteriorates. Therefore, in B', when the composition ratio of at least one of Zr and Hf, and Ti is represented by (1-p):p, p preferably satisfies $0.6 \leq p$, and p more preferably satisfies $0.9 \leq p$.

In this embodiment, similar to the lower electrode 4, the upper electrode 6 is made of $SrRuO_3$ which has a thickness of about 50 nm and has preferred (100) orientation by an epitaxial growth method. In addition, the material for forming the upper electrode 6 is not limited to $SrRuO_3$, and known electrode materials such as Pt, Ir and $IrO_x$ can be used.

1-2. Method for Manufacturing Piezoelectric Film and Piezoelectric Element

Next, a method for manufacturing a piezoelectric film and a piezoelectric element will be described.

(1) First, a substrate 2 made of silicon whose surface is plane (110) is prepared. As cavities (ink cavities) should be formed on the silicon substrate as will be described below, the silicon substrate used for the substrate 2 should have a predetermined thickness necessary therefore.

Subsequently, the substrate 2 is loaded into a substrate holder and placed in a vacuum apparatus (not shown). In the vacuum apparatus, various targets are arranged to face the substrate 2 with a predetermined distance from each other, such as targets for the buffer layers each of which includes constituent elements of the buffer layers 7, 8 and 9 respectively, and targets for the lower electrode 4 and the upper electrode 6 each of which includes constituent elements thereof respectively. As the respective targets, what have the same or similar composition as that of the first buffer layer 7, second buffer layer 8 and third buffer layer 9, the lower electrode 4 and the upper electrode 6 can be properly used.

That is, as a target for the first buffer layer 7, what has the same composition as the desired YSZ or the composition approximate thereto can be used. As a target for the second buffer layer 8, what has the same composition as the desired $CeO_2$ or the composition approximate thereto can be used. As a target for the third buffer layer 9, what has the same composition as the desired $YBa_2Cu_3O_x$ or the composition approximate thereto can be used. Further, as a target for the lower electrode 4 and upper electrode 6, what has the composition of $SrRuO_3$ or the composition approximate thereto can be used, respectively.

Figure 4:
FIG. 4 is a sectional view schematically illustrating a manufacturing process of the piezoelectric element according to the first embodiment the present invention.

(2) Next, as shown in FIG. 4, the first buffer layer 7 is formed directly on the substrate 2 using the ion-beam assisted method mentioned above. The details thereof are as follows.

According to a laser ablation method, when laser light is radiated onto the target for the first buffer layer 7, atoms containing an oxygen atom and a metal atom are driven out of this target, thereby generating plume. This plume is emitted toward the substrate 2 and comes to contact on the substrate 2. At almost the same time, an ion-beam assisted method is carried out by radiating ion beams at a predetermined angle (incidence), which will be mentioned below, onto the surface of the substrate 2. Consequently, irrespective of the formation of a natural oxide film on the substrate 2, the first buffer layer 7 made of YSZ with (100) orientation in a cubic crystal system is formed on the substrate 2 by epitaxial growth.

In addition, as an other method for making the constituent atoms of YSZ driven out of the target rather than the method of radiating laser light onto the surface of the target as described above, a method of radiating (incidence), for example, argon (inert gas) plasma, electron beam, etc., onto the surface of the target can be employed. Among these methods, the method of irradiating laser light onto the surface of the target is most preferable. According to this method, it is possible to easily and reliably make atoms driven out of the target by using a simply structured vacuum apparatus with an entrance window of laser light.

As laser light used for irradiating the target, pulsed light whose wavelength is about 150 to 300 nm and whose pulse duration is about 1 to 100 ns is suitable. Specifically, excimer lasers such as an ArF excimer laser, a KrF excimer laser and a XeCl excimer laser and, a YAG laser, a $YVO_4$ laser, a $CO_2$ laser, etc., can be exemplified. Among them, an ArF excimer laser or a KrF excimer laser is especially suitable. Either of ArF excimer laser and KrF excimer laser is easy to be handled and can make atoms driven out of the target more efficiently.

An ion radiated onto the substrate 2 by an ion-beam assisted method is not specifically limited, and, for example, at least one kind of ions of inert gases such as Ag, He, Ne, Xe and Kr or the ions mixed with oxygen can be used. As an ion source for this ion beam, it is preferable to use a Kauffman ion source, etc., for example. By using this ion source, it is possible to comparatively easily generate an ion beam.

The incident (radiation) angle, i.e., the predetermined angle mentioned above, of the ion beam onto the substrate 2, is not specifically limited, and it is preferable to be inclined at angle of about 35 to 65° with respect to the surface of the substrate 2. Especially, when forming the first buffer layer 7 using a metallic oxide of an NaCl structure as a main substance, it is preferable that the radiation angle is about 42 to 47°, and when forming the first buffer layer 7 using a metallic oxide of a fluorite structure as a main substance, it is preferable that the radiation angle is about 52 to 57°. In this embodiment, since the first buffer layer 7 is formed of YSZ which is a metallic oxide of a fluorite structure, it is preferable that the radiation angle is about 52 to 57°, especially 55°. By radiating ion beams onto the substrate 2 at such a radiation angle, the first buffer layer 7 with (100) orientation can be satisfactorily formed.

While making ions such as argon incident from the direction (111) onto the target, laser ablation is carried out. However, when the first buffer layer 7 is formed of a metallic oxide of an NaCl structure, such as MgO, the laser ablation is carried out while making ions such as argon, etc., incident from the direction (110) onto the target.

The conditions employed for forming the first buffer layer 7 is not specifically limited as long as the first buffer layer 7 is formed by epitaxial growth, and the following conditions can be employed, for example.

As the frequency of laser light, it is preferable to be 30 Hz or less, and it is more preferable to be 15 Hz or less. As the energy density of laser light, it is preferable to be 0.5 $J/cm^2$ or more, and it is more preferable to be 2 $J/cm^2$ or more.

As the accelerating voltage of an ion beam, it is preferable to be about 100 to 1000 V. As the amount of radiation of ion beams, it is preferable to be about 1 to 30 mA, and it is more preferable to be about 5 to 15 mA.

As the temperature of the substrate 2, it is preferable to be about 0 to 50° C., and it is more preferable to be a room temperature (5 to 30° C.). As the distance between the substrate 2 and a target, it is preferable to be 100 mm or less.

As the pressure in the vacuum apparatus, it is preferable to be $133 \times 10^{-1}$ Pa ($1 \times 10^{-1}$ Torr) or less, and it is more preferable to be $133 \times 10^{-3}$ Pa ($1 \times 10^{-3}$ Torr) or less. As the atmosphere in the vacuum apparatus, it is preferable to set the mixture ratio of inert gas and oxygen to be about 300:1 to 10:1 by the volume ratio, and it is more preferable to set the mixture ratio thereof to be about 150:1 to 50:1.

By setting the conditions for forming the first buffer layer 7 as described above, the first buffer layer 7 can be more efficiently formed by an epitaxial growth method.

Further, by suitably setting up the radiation time of laser light and ion beams, the average thickness of the first buffer layer 7 can be adjusted to the thickness mentioned above, i.e., about 1 μm. The radiation time of laser light and ion beams is varied depending on the above-mentioned conditions, and usually, it is preferable to be 200 seconds or less and it is more preferable to be 100 seconds or less.

According to this method of forming the first buffer layer 7, by employing the ion-beam assisted method which adjusts the radiation angle of ion beams, it is possible to satisfactorily form the first buffer layer 7 with (100) orientation in a cubic crystal system as described above, irrespective of whether or not a natural oxide film is formed on the surface of the substrate 2. In addition, according to this method, since the orientation of the first buffer layer 7 can be arranged with sufficient accuracy, the average thickness of the first buffer layer 7 can also be made smaller, if necessary.

Figure 5:
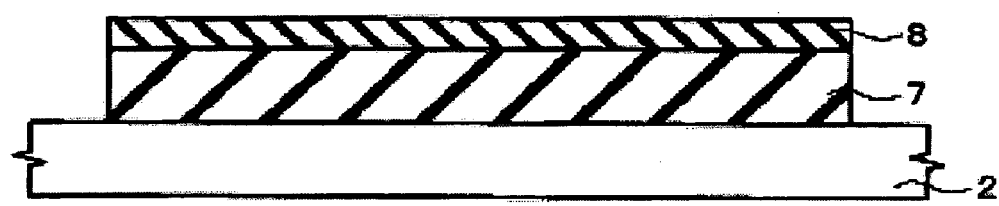
FIG. 5 is a sectional view schematically illustrating a manufacturing process of the piezoelectric element according to the first embodiment of the present invention.

(3) Next, as shown in FIG. 5, the second buffer layer 8 is formed on the first buffer layer 7. Unlike the first buffer layer 7 which is formed on the natural oxide film, since the second buffer layer 8 is formed on the first buffer layer 7 which has a good crystal structure, a laser ablation method is used rather than an ion-beam assisted method. That is, rather than the target for the first buffer layer 7, a target for the second buffer layers 8 which has a composition of the desired $CeO_2$ or the composition approximate thereto. Then, when laser light is radiated onto the target for the second buffer layer 8, oxygen and metal elements come to be driven out of the target, thereby generating plume. Then, the plume is emitted toward and is caused to contact with the first buffer layer 7 formed on the substrate 2. Consequently, the second buffer layer 8 is formed on the first buffer layer 7 by an epitaxial growth method.

The conditions employed for a laser ablation method of forming the second buffer layer 8 can be set as same as those employed for a laser ablation method of forming the first buffer layer 7.

Figure 6:
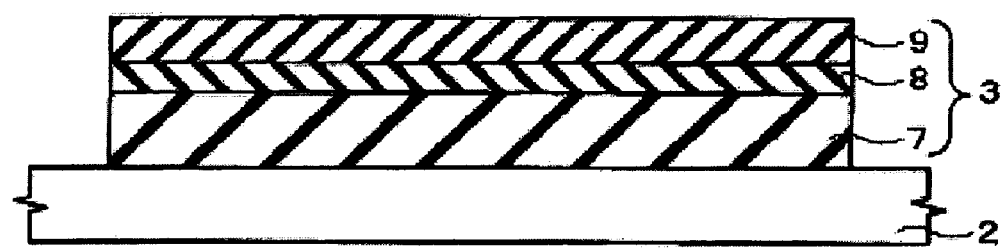
FIG. 6 is a sectional view schematically illustrating a manufacturing process of the piezoelectric element according to the first embodiment of the present invention.

(4) Next, as shown in FIG. 6, the third buffer layer 9 is formed on the second buffer layer 8. In this way, the buffer layer 3 comprised of the first buffer layer 7, the second buffer layer 8, and the third buffer layer 9 can be obtained. In order to form the third buffer layer 9, the laser ablation method is independently used as in the second buffer layer 8. That is, instead of the target for the second buffer layer 8, a target for the third buffer layer 9 with a composition of a desired $YBa_2Cu_3O_x$ or the composition approximate thereto is prepared. Then, when laser light is radiated onto the target for the third buffer layer 9, oxygen and metal elements are driven out of the target, thereby generating plume. Then, the plume is emitted toward and contacts with the surface of the second buffer layer 8 formed on the substrate 2. Consequently, the third buffer layer 9 is formed on the second buffer layer 8 by an epitaxial growth method.

In addition, if necessary, the third buffer layer 9 can also be formed by an ion-beam assisted method, similar to the process for forming the first buffer layer 7. That is, the third buffer layer 9 can be formed on the second buffer layer 8 by radiating ion beams onto the surface of the second buffer layer 8. By using an ion-beam assisted method, it is possible to more efficiently form the third buffer layer 9.

The conditions for forming the third buffer layer 9 is specifically limited as long as various metal atoms reach the second buffer layer 8 at a predetermined ratio (i.e., a composition ratio in the metallic oxide which has a perovskite structure), and the third buffer layer 9 is formed by an epitaxial growth method. For example, the following conditions are employable.

As the frequency of laser light, it is preferable to be about 30 Hz or less, and it is more preferable to be 15 Hz or less. As the energy density of laser light, it is preferable to be 0.5 $J/cm^2$ or more, and it is more preferable to be 2 $J/cm^2$ or more.

As the temperature of the substrate 2 on which the second buffer layer 8 is formed, it is preferable to be about 300 to 800° C., and it is more preferable to be about 700° C. When using ion beam radiation together, the temperature is preferably about 0 to 50° C., and more preferably, a room temperature (5 to 30° C.). As the distance between a target and the substrate 2 on which the second buffer layer 8 is formed, it is preferable to be about 60 mm or less, and it is more preferable to be about 45 mm or less.

Further, the pressure in vacuum apparatus is preferable to be 1 atmospheric pressure or less, and among them, the partial pressure of oxygen is preferable to be about $399 \times 10^{-2}$ Pa ($3 \times 10^{-2}$ Torr). When using ion beam irradiation together, the pressure in vacuum apparatus is preferably $133 \times 10^{-1}$ Pa ($1 \times 10^{-1}$ Torr) or less and more preferably, $133 \times 10^{-3}$ Pa ($1 \times 10^{-3}$ Torr) or less. In this case, as the atmosphere in the vacuum apparatus, the mixture ratio of the inert gas and oxygen is preferably about 300:1 to 10:1 by the volume ratio, and more preferably, about 150:1 to 50:1.

By setting the conditions for forming the third buffer layer 9 as described above, the third buffer layer 9 can be more efficiently formed by an epitaxial growth method. In this case, by suitably setting up the radiation time of laser light and ion beams, the average thickness of the third buffer layer 9 can be adjusted to the above-mentioned thickness, i.e., about 30 nm. The radiation time of laser light is varied depending on the above-mentioned conditions, but usually, it is preferable to be about 3 to 90 minutes and it is more preferable to be about 15 to 45 minutes.

Figure 7:
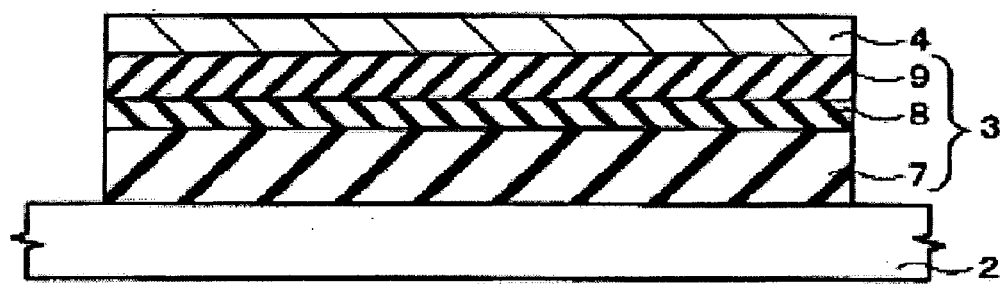
FIG. 7 is a sectional view schematically illustrating a manufacturing process of the piezoelectric element according to the first embodiment of the present invention.

(5) Next, as shown in FIG. 7, the lower electrode 4 is formed on the third buffer layer 9 (buffer layer 3). Since the lower electrode 4 is formed on the third buffer layer 9 having a good perovskite-type crystal structure, the lower electrode 4 is formed not using the ion-beam assisted method, but a laser ablation method. Specifically, in place of the target for the third buffer layer 9, a target for the lower electrode 4 having a desired composition of $SrRuO_3$ or a composition approximate thereto is employed, and the target is irradiated with laser light to drive oxygen atoms and metal atoms out of the target, thereby generating a plume. Then, the plume is emitted toward the third buffer layer 9 on the substrate 2 to contact with therewith, so that the lower electrode 4 is formed by epitaxial growth.

The respective conditions for forming the lower electrode 4 are not limited particularly, as long as various metal atoms reach the third buffer layer 9 at a predetermined ratio (that is, at a composition ratio of a metallic oxide having a perovskite structure), and the lower electrode 4 is obtained by epitaxial growth. For example, the same conditions as those of the laser ablation method when forming the third buffer layer 9 can be employed.

In addition, the ion-beam assisted method may be employed, if necessary, even in forming the lower electrode 4, similar to the processes of forming the third buffer layer 9. In other words, the lower electrode 4 may be formed on the third buffer layer 9 while irradiating ion beams onto the surface of the third buffer layer 9. By using ion-beam assisted method, the lower electrode 4 can be more efficiently formed.

The material for the lower electrode 4 is not limited to $SrRuO_3$, and electrode materials such as Ir, $IrO_x$, Nb—$SrTiO_3$, La—$SrTiO_3$, or Nb—$(La, Sr)CoO_3$ can also be used, for example.

Figure 8:
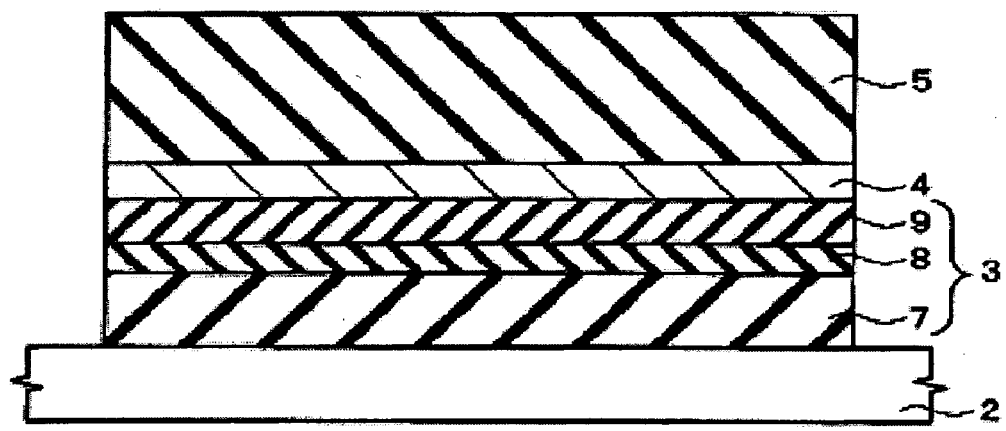
FIG. 8 is a sectional view schematically illustrating a manufacturing process of the piezoelectric element according to the first embodiment of the present invention.

(6) Next, as shown in FIG. 8, the piezoelectric film 5 is formed on the lower electrode 4. Typically, a coating film is formed using a precursor having the composition of the above-mentioned general formula (1) by a sol-gel method, and the coating film is then crystallized, so that the lower electrode 4 can be formed.

For the piezoelectric film 5, the first to fifth source solutions were mixed with each other by using the first to fifth source solutions, which will be described below, to be a desired ratio so that the piezoelectric film 5 could have a desired composition. This mixed solution (precursor solution) is arranged on the lower electrode 4 by a coating method such as a spin coating method or a liquid drop discharge method. Then, heat treatment such as baking is performed so that oxides contained in the precursor solution are crystallized, thereby obtaining the piezoelectric film 5.

More specifically, first, a series of processes including a precursor solution coating process, a dry heat treatment process and a degreasing heat treatment process are performed repeatedly as desired. Then, by performing a crystallization annealing process, the piezoelectric film 5 is formed.

As a first source solution, a solution where a condensation polymer for forming the $PbZrO_3$ perovskite crystal by Pb and Zr, among constituent metal elements of PXNB'Y, is dissolved in such a solvent as n-buthanol in an anhydrous state can be exemplified.

As a second source solution, a solution where a condensation polymer for forming the $PbTiO_3$ perovskite crystal by Pb and Ti, among constituent metal elements of PXNB'Y, is dissolved in such a solvent as n-buthanol in an anhydrous state can be exemplified.

As a third source solution, a solution where a condensation polymer for forming the $PbMgO_3$ or $PbZnO_3$ perovskite crystal by Pb, Mg, or Zn, among constituent metal elements of PXNB'Y, is dissolved in such a solvent as n-buthanol in an anhydrous state can be exemplified.

As a fourth source solution, a solution where a condensation polymer for forming the $PbNbO_3$ perovskite crystal by Pb and Nb, among constituent metal elements of PXNB'Y, is dissolved in such a solvent as n-buthanol in an anhydrous state can be exemplified.

As a fifth source solution, a solution where a condensation polymer for forming the $PbYO_3$ perovskite crystal by Pb and Y, among constituent metal elements of PXNB'Y, is dissolved in such a solvent as n-buthanol in an anhydrous state can be exemplified.

The source solution used for preparing the precursor solution is made by mixing organic metals, which contain each constituent metal of PXNB'Y, at the ratio capable of meeting the desired mole ratio of each metal, and dissolving or dispersing them in an organic solvent such as alcohol. As an organic metal which contains the constituent metal of PXNB'Y, an organic metal such as a metal alkoxide and an organic acids can be used. Specifically, as carboxylate or acetylacetonate complex containing constituent metals of PXNB'Y, the followings can be exemplified.

As an organic metal containing a lead (Pb), a lead acetate, etc., can be exemplified. As an organic metal containing magnesium (Mg), magnesium (II) acetate, etc., can be exemplified. As an organic metal containing zinc (Zn), zinc acetate, etc., can be exemplified. As an organic metal containing nickel (Ni), nickel acetylacetonate, etc., can be exemplified. As an organic metal containing zirconium (Zr), zirconium butoxide, etc., can be exemplified. As an organic metal containing titanium (Ti), titanium isopropoxide, etc., can be exemplified. As an organic metal containing hafnium (Hf), hafnium acetylacetonate, etc., can be exemplified. As an organic metal containing vanadium (V), vanadium acetylacetonate oxide, etc., can be exemplified. As an organic metal containing niobium (Nb), niobium ethoxide, etc., can be exemplified. As an organic metal containing tantalum (Ta), tantalum ethoxide, etc., can be exemplified. As an organic metal containing chromium (Cr), chromium (III) acetylacetonate, etc., can be exemplified. As an organic metal containing molybdenum (Mo), molybdenum (II) acetate, etc., can be exemplified. As an organic metal containing tungsten (W), tungsten hexacarbonyl, etc., can be exemplified. In addition, organic metals containing constituent metals of PXNB'Y are not necessarily limited to them mentioned above.

To the source solution, if necessary, various additives such a stabilizing agent can be added. Moreover, in order to perform hydrolysis or polycondensation on the source solution, an acid or base can be added as a catalyst along with a suitable quantity of water.

In the coating process of the precursor solution, a mixed solution is coated by using a coating method such as spin coating. First, mixed solution is dropped on the lower electrode 4. Spinning is performed in order to spread the dropped solution all over the lower electrode 4. The number of revolutions in the spinning process can be adjusted to about 500 rpms at early stage and then increased to about 2000 rpm so as not to cause irregular coating.

In the dry heat treatment process, heat treatment (drying treating) is performed using a hot plate in an ambient atmosphere, at a higher temperature than the boiling point of the solvent used for the precursor solution by about 10° C., for example. The dry heat treatment process can be performed, for example, at a temperature of 150 to 180° C.

In the degreasing heat treatment process, in order to decompose or remove ligands of the organic metals used for the source solution, heat treatment is performed using a hot plate in an ambient atmosphere at a temperature of about 350 to 400° C.

In the crystallization annealing process, i.e., the baking process for crystallization, heat treatment is performed at about 600° C. in an oxygen atmosphere. For example, this heat treatment can be performed by rapid thermal annealing (RTA).

The thickness of the piezoelectric film 5 after sintering can be about 500 to 1500 nm. In addition, although the above embodiment has been described in connection with the example in which a piezoelectric film 5 is formed by a sol-gel method, it can be applicable to a gas phase method such as a sputtering method, a molecule beam epitaxial method, a laser ablation method, etc. Further, when partially replacing Pb located at A site of the perovskite crystal structure in the piezoelectric film 5 with an element of lanthanoids, for example, as described above, a source solution is prepared using an organic metal containing an element of lanthanoids and then the piezoelectric film 5 can be formed using the source solution. In detail, as an organic metal containing an element of lanthanoids, the followings can be exemplified.

As an organic metal containing lanthanum (La), lanthanum acetylacetonate dihydrate, etc., can be exemplified. As an organic metal containing neodymium (Nd), neodymium (III) acetate monohydrate can be exemplified. As an organic metal containing cerium (Ce), cerium (III) acetic acid hydrate(I), etc., can be exemplified. As an organic metal containing samarium (Sm), samarium (III) acetate tetrahydrate, etc., can be exemplified. As an organic metal containing praseodymium (Pr), praseodymium (III) acetate hydrate, etc., can be exemplified. In addition, organic metals containing an element of lanthanoid series are not limited to them mentioned above.

(7) Next, as shown in FIG. 1, the upper electrode 6 is formed on the piezoelectric film 5. The upper electrode 6 can be formed by, for example, a sputtering method or a vacuum vapor deposition method. A lower electrode can be made of Pt as a main component. A material for an upper electrode 6, it is not limited to Pt, and well-known conventional electrode materials such as Ir, $IrO_x$, $SrRuO_3$, Nb—$SrTiO_3$, La—$SrTiO_3$ and Nb—$(La, Sr)CoO_3$ can also be employed.

(8) Next, if necessary, post-annealing can be performed in an oxygen atmosphere using RTA and the like. Thereby, it is possible to form a satisfactory interface between the upper electrode 6 and the piezoelectric film 5, and to improve the crystallinity of the piezoelectric film 5.

Using the above processes, it is possible to manufacture a piezoelectric film and a piezoelectric element according to the embodiment of the present invention.

1-3. Operation and Advantages

According to the piezoelectric element 1 of the present invention, since the piezoelectric film 5 has good piezoelectric properties, a piezoelectric element 1 also becomes a highly efficient one. Especially, since the insulation properties of the piezoelectric film 5 are good, the repeated durability of the piezoelectric element 1 is significantly improved.

The piezoelectric constant ($d_{31}$) of the piezoelectric film 5 according to this embodiment can be, for example, 200 pC/N or more as an absolute value. The leak current of the piezoelectric element 1 according to this embodiment can be less than $10^{-5}$ $A/cm^2$ when, for example, input voltage is 100 kV/cm. The repeated durability of the piezoelectric element 1 according to this embodiment can guarantee $1 \times 10^9$ times when input voltage is 300 kV/cm.

1-4. Experiment 1

Based on the manufacturing method of the above-mentioned piezoelectric element, the piezoelectric element 1 was produced as follows.

First, the substrate 2, made of silicon, whose surface is the plane (110), was prepared. Then, the substrate 2 was loaded into a substrate holder and placed in a vacuum apparatus (not shown). In the vacuum apparatus, various targets were arranged to face the substrate 2 with a predetermined distance from each other, such as targets for the buffer layers each of which includes constituent elements comprised of the buffer layers 7, 8 and 9, respectively, and targets for the lower electrode 4 and the upper electrode 6 each of which includes constituent elements consisting thereof respectively. As a target for the first buffer layer 7, a desired YSZ composition was used. As a target for the second buffer layer 8, a desired $CeO_2$ composition was used. As a target for the third buffer layer 9, a desired $YBa_2Cu_3O_x$ composition was used. As targets for the lower electrode 4 and the upper electrode 6, $SrRuO_3$ composition was used, respectively.

Next, the first buffer layer 7 made of YSZ with (100) orientation in a cubic crystal system was formed by epitaxial growth on the substrate 2 using an ion-beam assisted method. As the laser light radiated onto the target, KrF laser whose wavelength is 248 nm and whose pulse duration is 20 ns was used.

As the ion beam radiated onto the surface of the substrate 2 by an ion-beam assisted method, Argon ions were used. As the ion source of the ion beam, Kauffman ions were used.

The radiation (incidence) angle of the ion beam onto the surface of the substrate 2 was inclined by 55° with respect to the surface of the substrate 2.

The frequency of the laser light was set to 10 Hz. The energy density of the laser light was set to 2.0 $J/Cm^2$. The accelerating voltage of the ion beam was set to 200 V. The radiation amount of the ion beam was set to 8 mA. The temperature of the substrate 2 was set to 30° C. The distance between the substrate 2 and the target was set to 70 mm. The pressure in the vacuum apparatus was set to $1 \times 10^{-3}$ Torr. As an atmosphere in vacuum apparatus, the mixture ratio of inert gas and oxygen was set to 10:1 by the volume ratio. The average thickness of the first buffer layer 7 was 1 µm.

Then, the second buffer layer 8 was formed on the first buffer layer 7. A laser ablation method was used for forming the second buffer layer 8. As a target for the second buffer layer 8, a desired $CeO_2$ composition was used.

The conditions of the laser ablation method for forming the second buffer layer 8 were the same as those applied to the laser ablation method employed for forming the first buffer layer 7. The film thickness of the second buffer layer 8 was set to 30 nm.

Then, the third buffer layer 9 was formed on the second buffer layer 8. A laser ablation method was used for forming the third buffer layer 9. As a target for the third buffer layer 9, a desired $YBa_2Cu_3O_x$ composition was used.

The frequency of the laser light was set to 10 Hz. The energy density of the laser light was set to 2.0 $J/cm^2$. The temperature of the substrate 2 was set to 700° C. The distance between the substrate 2 and the target was set to 40 mm. The pressure in the vacuum apparatus was set to $1 \times 10^{-2}$ Torr. The average thickness of the third buffer layer 9 was set to 10 nm.

Next, the lower electrode 4 was formed on the third buffer layer 9 (buffer layer 3). The lower electrode 4 was formed by a sputtering method. Pt was used as the lower electrode 4.

Then, the piezoelectric film 5 was formed on the lower electrode 4. First, using the first to fifth source solutions, which will be described below, the first to fifth source solutions were mixed with each other at such a desired ratio that the piezoelectric film 5 can have a desired composition. This mixed solution (precursor solution) was coated on the lower electrode 4 by a spin coating method. Then, heat treatment was performed using baking etc., thereby obtaining the piezoelectric film 5.

In more detail, a series of processes of a precursor solution coating process, a dry heat treatment process, and a degreasing heat treatment process were carried out a desired number of times. Then, by performing a crystallization annealing process, the piezoelectric film 5 was formed.

As the first source solution, a solution made by mixing lead acetate and zirconium butoxide with each other at a ratio of 110:100 and then dissolving the mixture in a solvent such as n-buthanol in an anhydrous state can be used. As the second source solution, a solution made by mixing lead acetate and titanium isopropoxide with each other at a ratio of 110:100 and then dissolving the mixture in a solvent such as n-buthanol in an anhydrous state can be used. As the third source solution, a solution made by mixing lead acetate and magnesium acetate with each other at a ratio of 110:100 and then dissolving this mixture in a solvent such as n-buthanol in an anhydrous state can be used. As the fourth source solution, a solution made by mixing lead acetate and niobium ethoxide with each other at a ratio of 110:100 and then dissolving this mixture in a solvent such as n-buthanol in an anhydrous state can be used. As the fifth source solution, a solution made by mixing lead acetate and niobium ethoxide with each other at a ratio of 110:100 and then dissolving this mixture in a solvent such as n-buthanol in an anhydrous state can be used. By mixing these first source solution, second source solution, third source solution, fourth source solution, and fifth source solution with each other at the following ratios, the precursor solution was obtained.

First source solution:Second source solution=2:98
Third source solution:Fourth source solution=33:66
(First source solution+Second source solution):(Third source solution+Fourth source solution)=33:67

(First source solution+Second source solution+Third source solution+Fourth source solution):Fifth source solution=80:20

That is to say, First source solution:Second source solution:Third source solution:Fourth source solution:Fifth source solution=0.5:25.9:17.4:34.8:20.

In the precursor solution coating process, the mixed solution was coated by a spin coating method. First, the mixed solution was dropped onto the lower electrode 4. A spinning process was performed in order to spread the dropped solution all over the lower electrode 4. The number of revolutions in the spinning process was adjusted to about 500 rpms at an early stage and increased to about 2000 rpms so as to prevent irregular coating from occurring. In this way, the coating was completed.

In the dry heat treatment process, heat treatment (drying treatment) was performed using a hot plate in an ambient atmosphere at a temperature of 125° C. for 10 minutes. In the degreasing heat treatment process, heat treatment was performed using a hot plate in an ambient atmosphere at a temperature of 400° C. for 10 minutes. In the baking process for crystallization, heat treatment was performed in an oxygen atmosphere at a temperature of 600° C. for 5 minutes. These heat treatments are performed by rapid thermal annealing (RTA). The thickness of the piezoelectric film 5 after sintering was 1000 nm.

Next, the upper electrode 6 was formed on the piezoelectric film 5. The upper electrode 6 was formed by a sputtering method. As the upper electrode, Pt was used. Then, post-annealing was performed by RTA in an oxygen atmosphere. The post-annealing was performed at a temperature of 600° C. for 10 minutes.

Figure 9:
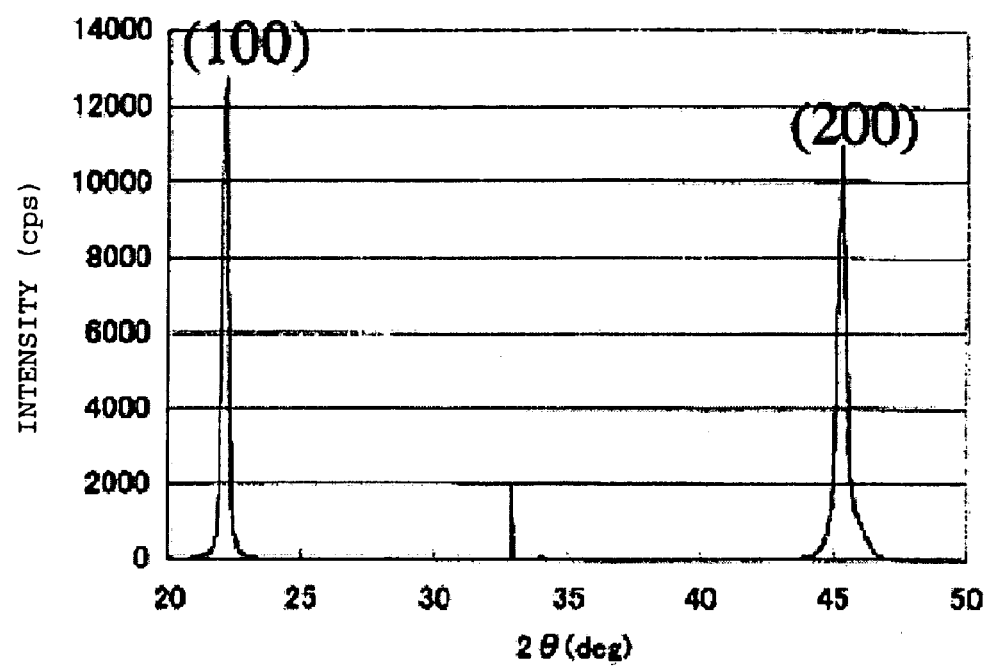
FIG. 9 shows the result of X-ray diffraction.

In the piezoelectric element 1 obtained according to the way described above, especially, the piezoelectric film 5 was analyzed by the X-ray diffraction (XRD) method. The result is shown in FIG. 9. From this result, it was proved that the piezoelectric film 5 has preferred (100) orientation in a pseudo-cubic crystal system at a room temperature. Further, from the result of analysis of the piezoelectric film 5 using Raman scattering method, it was found that the piezoelectric film has a perovskite structure and a rhombo-hedral structure. Moreover, according to Raman analysis, it was confirmed that Nb added to $Pb((Mg_{1/3}Nb_{2/3})_{1-c}(Zr_{1-p}Ti_p)_c)O_3$ is located at B site of a perovskite structure. That is, a peak that indicates a vibration mode caused by B site ions referred to as $A_1(2TO)$ was shifted toward the low wave number as compared to when the additive amount of Nb is almost zero. This shows that excessively added Nb is substituted at B site.

Further, according to the result of investigating the composition of the piezoelectric film 5 using XPS method, when the composition is represented by the general formula, $Pb_{1-b}((Mg_{1/3}Nb_{2/3})_{1-c}(Zr_{1-p}Ti_p)_c)_{1-a}Nb_aO_3$, a was 0.20, b was 0.10, c was 0.34, p was 0.98. These numerical values are within the preferable ranges of the above-mentioned a, b, c, and p. In addition, as a method for determining b equivalent to the deficient amount of Pb, from the total sum Q of the composition ratio of transition metal atoms located at B site obtained by XPS method, and the composition ratio S of Pb, b was determined by b=(Q−s)/Q. That is, assuming that B site has no defect, the deficient amount b of Pb was determined from the chemical formula.

In addition, according to a measuring result, the piezoelectric constant ($d_{31}$) of this piezoelectric film 5 was 420 pC/N in the absolute value. Further, leak current was less than $10^{-5}$ A/cm² at 100 kV/cm. Moreover, according to a result measured at 300 kV/cm, it was proved that the repeated durability of the piezoelectric element 1 could guarantee $1 \times 10^9$ times.

In addition, the measuring method of a piezoelectric constant ($d_{31}$) is as follows. First, in an actual ink-jet type recording head 50 (refer to FIG. 10), the displacement S1 of the piezoelectric film 5 at the time of the voltage input is measured using a laser displacement meter. By comparing values S1 and S2 which can be obtained by the simulation of the piezoelectric displacement according to a finite element method, it is possible to obtain the finite difference between the actual piezoelectric constant ($d_{31}$) of the piezoelectric film 5, and the piezoelectric constant ($d'_{31}$) of the piezoelectric film 5 assumed by the finite element method. Consequently, the piezoelectric constant ($d_{31}$) of the piezoelectric film 5 can be measured. In addition, physical values needed for the simulation of piezoelectric displacement according to the finite element method are Young's modulus of each film and film stress. In this Experiment, S1 was about 500 to 600 nm. Further, the simulation was performed by setting Young's modulus of the piezoelectric film 5 to 30 GPa and the compressive stress of the film to 100 MPa.

1-5. Experiment 2

In this experiment, using the same method as the method for forming the piezoelectric film 5 in Experiment 1, the piezoelectric film 5 was formed. However, in order to study in more detail the composition ratio "a" of $Pb_{1-b}((Mg_{1/3}Nb_{2/3})_{1-c}(Zr_{1-p}Ti_p)_c)_{1-a}Nb_aO_3$, the solutions for forming the piezoelectric film 5 were changed as follows.

By mixing these first source solution, second source solution, third source solution, fourth source solution, and fifth solution with each other at the ratios shown below, the precursor solution was obtained.

First source solution:Second source solution=1:99
Third source solution:Fourth source solution=33:66
(First source solution+Second source solution):(Third source solution+Fourth source solution)=31:69
(First source solution+Second source solution+Third source solution+Fourth source solution):Fifth source solution=(100−Z):Z The results obtained by investigating the composition of the piezoelectric film 5 using XPS method are shown in Table 1. Here, the general formula is represented by $Pb_{1-b}((Mg_{1/3}Nb_{2/3})_{1-c}(Zr_{1-p}Ti_p)_c)_{1-a}Nb_aO_3$. Absolute values of the piezoelectric constant ($d_{31}$) after repeated endurance tests are also shown in Table 1. In addition, the repeated endurance tests were performed by applying 300 kV/cm repeatedly, i.e., $1 \times 10^9$ times.

TABLE 1

| Z  | a    | b     | c    | p    | $d_{31}$ (pC/N) |
|----|------|-------|------|------|-----------------|
| 0  | 0.00 | 0.090 | 0.31 | 0.01 | 150             |
| 5  | 0.05 | 0.025 | 0.31 | 0.01 | 410             |
| 10 | 0.11 | 0.049 | 0.31 | 0.01 | 420             |
| 15 | 0.15 | 0.075 | 0.30 | 0.01 | 410             |
| 20 | 0.19 | 0.104 | 0.31 | 0.01 | 410             |
| 25 | 0.25 | 0.126 | 0.31 | 0.01 | 400             |
| 30 | 0.30 | 0.157 | 0.32 | 0.01 | 40              |

As shown in Table 1, it was confirmed that the optimal ranges of "a" and "b" showing a high piezoelectric constant of 200 pC/N or more are respectively $0.05 \leq a < 0.30$ and $0.025 \leq b \leq 0.15$.

1-6. Experiment 3

In this experiment, using the same method as the method for forming the piezoelectric film 5 in Experiment 1, the piezoelectric film 5 was formed. However, in order to study in more detail the composition ratio "a" of $Pb_{1-b}((Ni_{1/3}Nb_{2/3})_{1-c}(Zr_{1-p}Ti_p)_c)_{1-a}Nb_aO_3$, the solutions for forming the piezoelectric film 5 were changed as follows.

As the third source solution, a solution made by mixing lead acetate and nickel acetylacetonate with each other at a ratio of 110:100 and then dissolving this mixture in a solvent such as n-buthanol in an anhydrous state was used. By mixing these first source solution, second source solution, third source solution, fourth source solution, and fifth solution with each other at the rations shown below, the precursor solution was obtained.

First source solution:Second source solution=3:97

Third source solution:Fourth source solution=33:66

(First source solution+Second source solution):(Third source solution+Fourth source solution)=35:65

(First source solution+Second source solution+Third source solution+Fourth source solution):Fifth source solution=(100−Z):Z The results obtained by investigating the composition of the piezoelectric film 5 using XPS method are shown in Table 2. Here, the general formula is represented by $Pb_{1-b}((Ni_{1/3}Nb_{2/3})_{1-c}(Zr_{1-p}Ti_p)_c)_{1-a}Nb_aO_3$. Absolute values of the piezoelectric constant ($d_{31}$) after repeated endurance tests are also shown Table 2. In addition, repeated endurance tests were performed similar to Experiment 2.

TABLE 2

| Z | a | b | c | p | $d_{31}$ (pC/N) |
|---|---|---|---|---|---|
| 0 | 0.00 | 0.090 | 0.35 | 0.03 | 110 |
| 5 | 0.05 | 0.026 | 0.35 | 0.03 | 210 |
| 10 | 0.10 | 0.051 | 0.35 | 0.03 | 250 |
| 15 | 0.15 | 0.075 | 0.35 | 0.03 | 200 |
| 20 | 0.20 | 0.101 | 0.35 | 0.03 | 260 |
| 25 | 0.25 | 0.123 | 0.35 | 0.03 | 200 |
| 30 | 0.30 | 0.151 | 0.35 | 0.03 | 5 |

As shown in Table 2, it was confirmed that the optimal ranges of "a" and "b" showing a high piezoelectric constant of 200 pC/N or more are respectively $0.05 \leq a < 0.30$ and $0.025 \leq b \leq 0.15$.

1-7. Experiment 4

In this experiment, using the same method as the method for forming the piezoelectric film 5 in Experiment 1, the piezoelectric film 5 was formed. However, in order to study in more detail the composition ratio "a" of $Pb_{1-b}((Zn_{1/3}Nb_{2/3})_{1-c}(Zr_{1-p}Ti_p)_c)_{1-a}Nb_aO_3$, the solutions for forming the piezoelectric film 5 were changed as follows.

As the third source solution, a solution made by mixing lead acetate and zinc acetate with each other at a ratio of 110:100 and then dissolving this mixture in a solvent such as n-buthanol in an anhydrous state can be used. By mixing these first source solution, second source solution, third source solution, fourth source solution, and fifth solution with each other at the ratios shown below, the precursor solution was obtained.

First source solution:Second source solution=5:95

Third source solution:Fourth source solution=33:66

(First source solution+Second source solution):(Third source solution+Fourth source solution)=9:91

(First source solution+Second source solution+Third source solution+Fourth source solution):Fifth source solution=(100−Z):Z The results obtained by investigating the composition of the piezoelectric film 5 using XPS method are shown in Table 3. Here, the general formula is represented by $Pb_{1-b}$ $((Zn_{1/3}Nb_{2/3})_{1-c}(Zr_{1-p}Ti_p)_c)_{1-a}Nb_aO_3$. Absolute values of the piezoelectric constant ($d_{31}$) after repeated endurance tests are also shown in Table 3. In addition, repeated endurance tests were performed similar to Experiment 2.

TABLE 3

| Z | a | b | c | p | $d_{31}$ (pC/N) |
|---|---|---|---|---|---|
| 0 | 0.00 | 0.120 | 0.09 | 0.05 | 90 |
| 5 | 0.05 | 0.025 | 0.09 | 0.05 | 280 |
| 10 | 0.10 | 0.050 | 0.09 | 0.05 | 210 |
| 15 | 0.15 | 0.076 | 0.09 | 0.05 | 270 |
| 20 | 0.20 | 0.099 | 0.09 | 0.05 | 230 |
| 25 | 0.25 | 0.117 | 0.09 | 0.05 | 240 |
| 30 | 0.30 | 0.160 | 0.09 | 0.05 | 30 |

As shown in Table 3, it was confirmed that the optimal ranges of "a" and "b" showing a high piezoelectric constant of 200 pC/N or more are respectively $0.05 \leq a < 0.30$ and $0.025 \leq b \leq 0.15$.

1-8. Experiment 5

In this experiment, using the same method as the method for forming the piezoelectric film 5 in Experiment 1, the piezoelectric film 5 was formed. However, in order to study in more detail the composition ratio "c" of $Pb_{1-b}((Mg_{1/3}Nb_{2/3})_{1-c}(Zr_{1-p}Ti_p)_c)_{1-a}Nb_aO_3$, the solutions for forming the piezoelectric film 5 were changed as follows.

By mixing these first source solution, second source solution, third source solution, fourth source solution, and fifth solution with each other at the ratios shown below, the precursor solution was obtained.

First source solution:Second source solution=1:99

Third source solution:Fourth source solution=33:66

(First source solution+Second source solution):(Third source solution+Fourth source solution)=C:(100−C)

(First source solution+Second source solution+Third source solution+Fourth source solution):Fifth source solution=85:15

The results obtained by investigating the composition of the piezoelectric film 5 using XPS method are shown in Table 4. Here, the general formula is represented by $Pb_{1-b}$ $((Mg_{1/3}Nb_{2/3})_{1-c}(Zr_{1-p}Ti_p)_c)_{1-a}Nb_aO_3$. Absolute values of the piezoelectric constant ($d_{31}$) after repeated endurance tests are also shown in Table 4. In addition, repeated endurance tests were performed similar to Experiment 2.

TABLE 4

| C | a | b | c | p | $d_{31}$ (pC/N) |
|---|---|---|---|---|---|
| 20 | 0.15 | 0.075 | 0.20 | 0.01 | 50 |
| 25 | 0.15 | 0.075 | 0.25 | 0.01 | 200 |
| 30 | 0.15 | 0.075 | 0.30 | 0.01 | 420 |
| 35 | 0.15 | 0.075 | 0.35 | 0.01 | 360 |
| 40 | 0.15 | 0.075 | 0.40 | 0.01 | 20 |

As shown in Table 4, it was confirmed that the optimal range of "c" showing a high piezoelectric constant of 200 pC/N or more is $0.25 \leq c \leq 0.35$.

1-9. Experiment 6

In this experiment, using the same method as the method for forming the piezoelectric film 5 in Experiment 1, the piezoelectric film 5 was formed. However, in order to study in more detail the composition ratio "c" of $Pb_{1-b}((Ni_{1/3}Nb_{2/3})_{1-c}(Zr_{1-p}Ti_p)_c)_{1-a}Nb_aO_3$, the solutions for forming the piezoelectric film 5 were changed as follows.

As the third source solution, a solution made by mixing lead acetate and nickel acetylacetonate with each other at a ratio of 110:100 and then dissolving this mixture in a solvent such as n-buthanol in an anhydrous state was used. By mixing these first source solution, second source solution, third source solution, fourth source solution, and fifth solution with each other at the ratios shown below, the precursor solution was obtained.

First source solution:Second source solution=3:97

Third source solution:Fourth source solution=33:66

(First source solution+Second source solution):(Third source solution+Fourth source solution)=C:(100−C)

(First source solution+Second source solution+Third source solution+Fourth source solution):Fifth source solution=85:15

The results obtained by investigating the composition of the piezoelectric film 5 using XPS method are shown in Table 5. Here, the general formula is represented by $Pb_{1-b}((Ni_{1/3}Nb_{2/3})_{1-c}(Zr_{1-p}Ti_p)_c)_{1-a}Nb_aO_3$. Absolute values of the piezoelectric constant ($d_{31}$) after repeated endurance tests are also shown in Table 5. In addition, repeated endurance tests were performed similar to Experiment 2.

TABLE 5

| C | a | b | c | p | $d_{31}$ (pC/N) |
|---|---|---|---|---|---|
| 25 | 0.15 | 0.075 | 0.25 | 0.03 | 80 |
| 30 | 0.15 | 0.075 | 0.30 | 0.03 | 230 |
| 35 | 0.15 | 0.075 | 0.35 | 0.03 | 230 |
| 40 | 0.15 | 0.075 | 0.40 | 0.03 | 220 |
| 45 | 0.15 | 0.075 | 0.45 | 0.03 | 30 |

As shown in Table 5, it was confirmed that the optimal range of "c" showing a high piezoelectric constant of 200 pC/N or more is $0.30 \leq c \leq 0.40$.

1-10. Experiment 7

In this experiment, using the same method as the method for forming the piezoelectric film 5 in Experiment 1, the piezoelectric film 5 was formed. However, in order to study in more detail the composition ratio "c" of $Pb_{1-b}((Zn_{1/3}Nb_{2/3})_{1-c}(Zr_{1-p}Ti_p)_c)_{1-a}Nb_aO_3$, the solutions for forming the piezoelectric film 5 were changed as follows.

As the third source solution, a solution made by mixing lead acetate and zinc acetate with each other at a ratio of 110:100 and then dissolving this mixture in a solvent such as n-buthanol in an anhydrous state can be used. By mixing these first source solution, second source solution, third source solution, fourth source solution, and fifth solution with each other at the ratios shown below, the precursor solution was obtained.

First source solution:Second source solution=5:95

Third source solution:Fourth source solution=33:66

(First source solution+Second source solution):(Third source solution+Fourth source solution)=C:(100−C)

(First source solution+Second source solution+Third source solution+Fourth source solution):Fifth source solution=85:15

The results obtained by investigating the composition of the piezoelectric film 5 using XPS method are shown in Table 6. Here, the general formula is represented by $Pb_{1-b}((Zn_{1/3}Nb_{2/3})_{1-c}(Zr_{1-p}Ti_p)_c)_{1-a}Nb_aO_3$. Absolute values of the piezoelectric constant ($d_{31}$) after repeated endurance tests are also shown in Table 6. In addition, repeated endurance tests were performed similar to Experiment 2.

TABLE 6

| C | a | b | c | p | $d_{31}$ (pC/N) |
|---|---|---|---|---|---|
| 3 | 0.15 | 0.075 | 0.03 | 0.05 | 50 |
| 5 | 0.15 | 0.075 | 0.05 | 0.05 | 220 |
| 10 | 0.15 | 0.075 | 0.10 | 0.05 | 270 |
| 15 | 0.15 | 0.075 | 0.15 | 0.05 | 210 |
| 20 | 0.15 | 0.075 | 0.20 | 0.05 | 10 |

As shown in Table 6, it was confirmed that the optimal range of "c" showing a high piezoelectric constant of 200 pC/N or more is $0.05 \leq c \leq 0.15$.

2. Second Embodiment 2-1. Ink-Jet Type Recording Head

Figure 10:
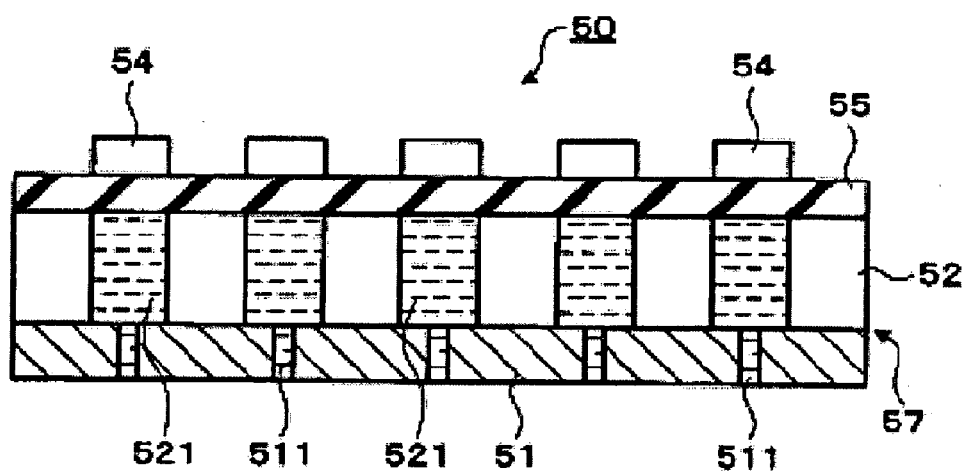
FIG. 10 is a schematic constructional view of an ink-jet type recording head according to a second embodiment of the present invention.
Figure 11:
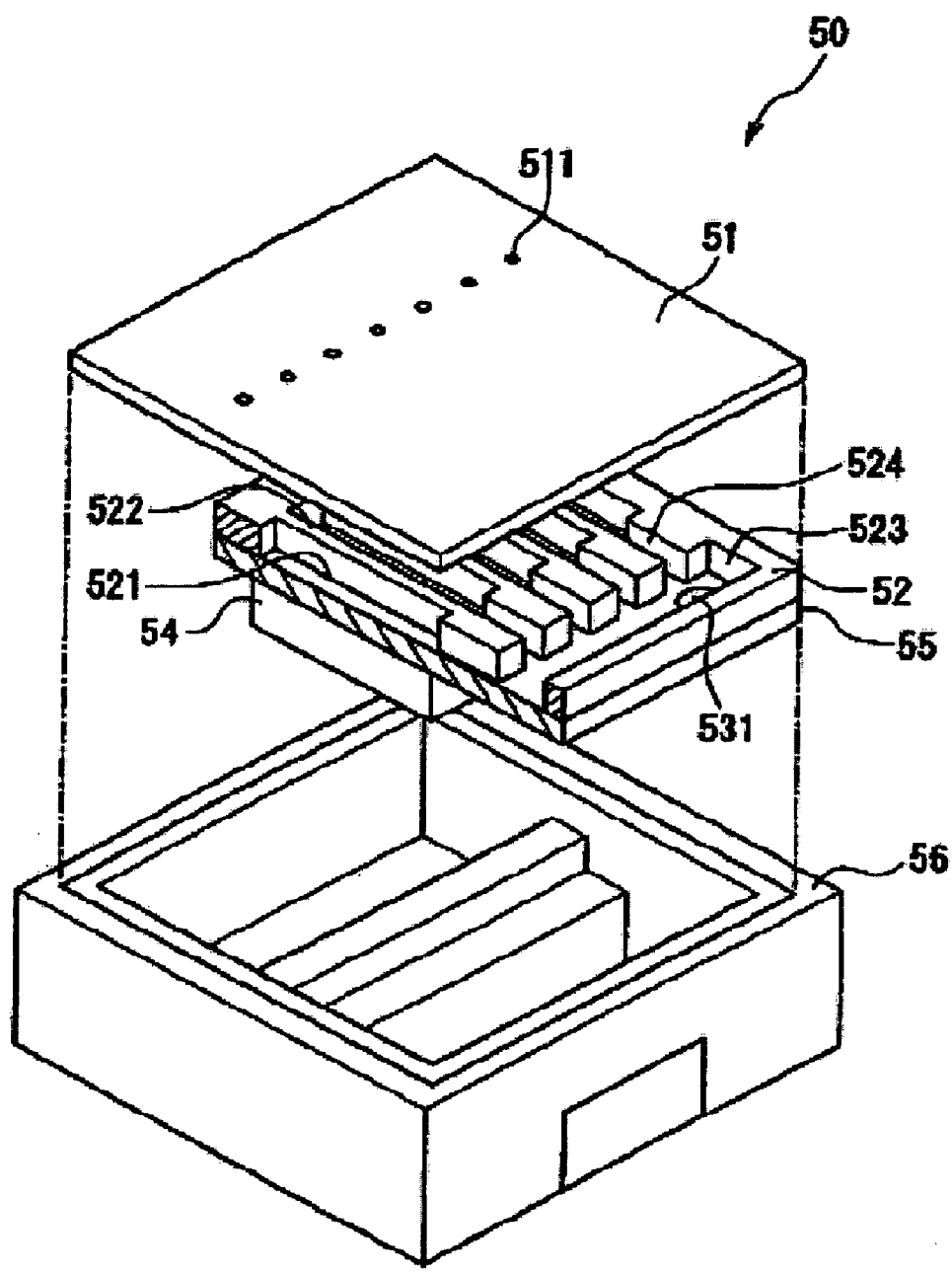
FIG. 11 is an exploded perspective view of the ink-jet type recording head according to the second embodiment of the present invention.

An ink-jet type recording head having a piezoelectric element 1 according to the first embodiment will be described below. FIG. 10 is a sectional side view showing a schematic structure of an ink-jet type recording head according to this embodiment. FIG. 11 is an exploded perspective view of this ink-jet type recording head. In addition, FIG. 11 shows a state in which a usually used state is inverted.

The ink-jet type recording head 50 (hereinafter, simply referred to as "head") includes a head body 57 and a piezoelectric portion 54 formed on the head body 57, as shown in FIG. 10. In addition, the piezoelectric portion 54 shown in FIG. 10 is equivalent to the buffer layer 3, the lower electrode 4, the piezoelectric film 5 and the upper electrode 6 of the piezoelectric element 1 shown in FIG. 1. In the ink-jet type recording head according to this embodiment, the piezoelectric element 1 can function as a piezoelectric actuator. The piezoelectric actuator is an element which has the function to move a certain substance.

Further, the buffer layer 3 of the piezoelectric element 1 shown in FIG. 1 is equivalent to the elastic film 55 shown in FIG. 10. The substrate 2 (refer to FIG. 1) constitutes the principal part of the head body 57.

That is, as shown in FIG. 11, the head 50 includes a nozzle plate 51, an ink chamber substrate 52, an elastic film 55, and the piezoelectric portion 54 (vibrating source) bonded to the elastic film 55, all of which are received in a base 56. In addition, the head 50 constitutes an on-demand type of piezo jet type head.

The nozzle plate 51 is comprised of, for example, a rolled plate made of stainless steel, etc., and a large number of nozzles 511 for discharging ink drops formed in one row. The pitch between these nozzles 511 can be suitably set according to the printing accuracy.

The ink chamber substrate 52 is anchored (fixed) to the nozzle plate 51. The ink chamber substrate 52 is formed by the substrate 2 (refer to FIG. 1). The ink chamber substrate 52 are formed with a plurality of cavities (ink cavities) 521, a reservoir 523 and supply ports 524, all of which are partitioned by the nozzle plate 51, side walls (partition walls) 522 and the elastic film 55. The reservoir 523 temporarily reserves the ink supplied from an ink cartridge 631 (refer to FIG. 14). Through the supply ports 524, ink is supplied to each cavity 521 from the reservoir 523.

The cavities 521 are arranged corresponding to each nozzle 511, as shown in FIGS. 10 and 11. The volume of the cavities 521 is variable by the vibration of the elastic film 55. Each cavity 521 is structured to discharge ink according to the volume change.

As a base material for obtaining the ink chamber substrate 52, i.e., a substrate 2 (refer to FIG. 1), a silicon single crystal substrate with (110) orientation can be used. Since the silicon single crystal substrate with (110) orientation is suitable for anisotropic etching, it is possible to form the ink chamber substrate 52 easily and certainly. In addition, such a silicon single crystal substrate is used so that the surface on which the buffer layer 3 is formed, i.e., the surface of the elastic film 55, shown in FIG. 1, can be plane (110).

The elastic film 55 is formed on the side of the ink chamber substrate 52 opposite to the nozzle plate 51. Moreover, a plurality of the piezoelectric portions 54 is formed on the side of the elastic film 55 opposite to the ink chamber substrate 52. The elastic film 55 is formed by the buffer layer 3 of the piezoelectric element 1 shown in FIG. 1 as described above. As shown in FIG. 11, at a predetermined position of the elastic film 55, a communicating hole 531 is formed to penetrate the elastic film 55 in its thickness direction. By the communicating hole 531, ink is supplied from the ink cartridge 631 to the reservoir 523.

Each piezoelectric portion 54 is electrically connected to a piezoelectric element driving circuit which will be mentioned below, such that it operates (vibrates, deformed) based on a signal from the piezoelectric element driving circuit. That is, each piezoelectric portion 54 functions as a vibration source (head actuator). The elastic film 55 is vibrated (is deflected) by the vibration (deflection) of the piezoelectric portion 54, and functions so as to increase the internal pressure in the cavity 521 momentarily.

The base 56 is formed of, for example, various resinous materials, various metallic materials, etc. As shown in FIG. 11, the ink chamber substrate 52 is fixed to and supported by the base 56.

2-2. Operation of Ink-Jet Type Recording Head

Figure 12:
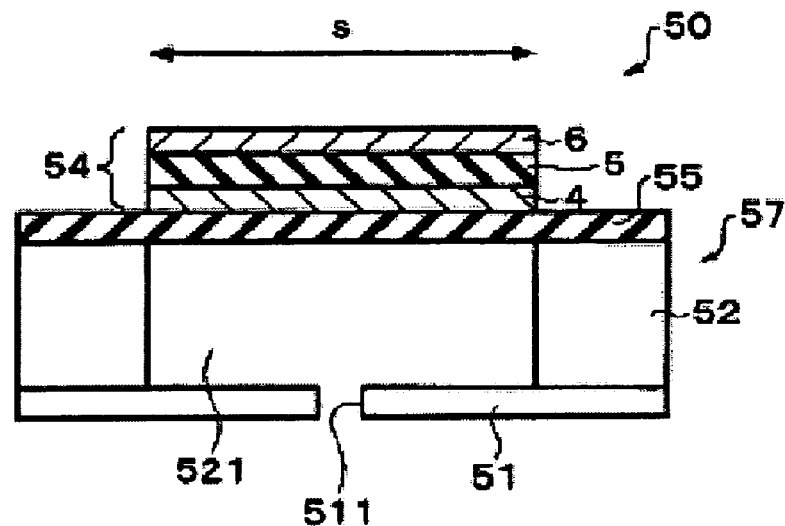
FIG. 12 is a diagram for explaining the operation of the ink-jet type recording head.

Next, the operation of the ink-jet type recording head 50 according to this embodiment will be described. In the head 50 according to this embodiment, in a state in which a predetermined discharge signal is not input through a piezoelectric element driving circuit, i.e., in a state in which any voltage is not input between the lower electrode 4 and the upper electrode 6 of the piezoelectric portion 54, as shown in FIG. 12, any deformation does not occur in the piezoelectric film 5. Therefore, no deformation occurs on the elastic film 55 and no volume change occurs in the cavity 521. Thus, ink drop is not discharged from the nozzle 511.

Figure 13:
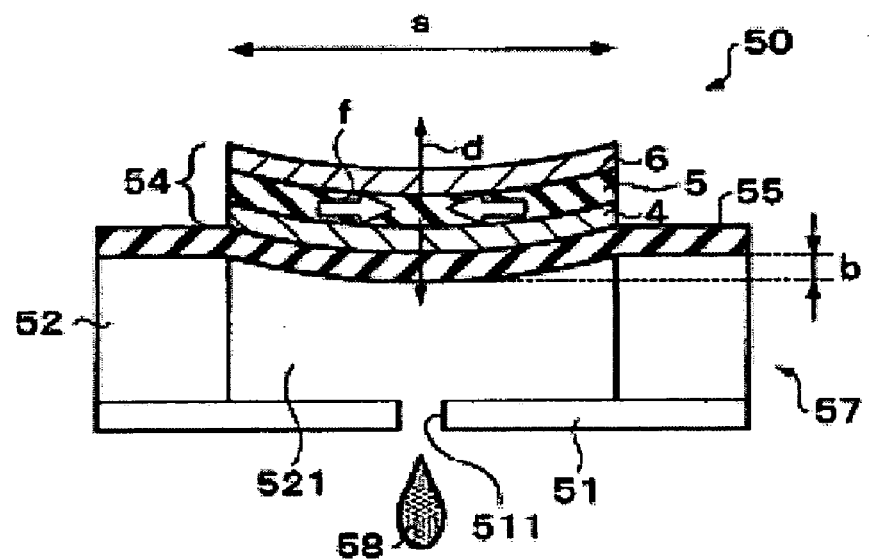
FIG. 13 is a diagram for explaining the operation of an ink-jet type recording head.

On the other hand, in a state in which a predetermined discharge signal is input through the piezoelectric element driving circuit, i.e., in a state in which any voltage is input between the lower electrode 4 and the upper electrode 6 of the piezoelectric portion 54, as shown in FIG. 13, the piezoelectric film 5 has the deflecting deformation occurred in the direction of a minor axis (the direction of the arrow "s" as shown in FIG. 13). Thereby, the elastic film 55 is deflected and a volume change in the cavity 521 occurs. At this time, the pressure in the cavity 521 increases momentarily, and ink drop 58 is discharged from the nozzle 511.

That is, when a voltage is input, crystal lattice of the piezoelectric film 5 is stretched in the direction (the direction of the arrow "d" as shown in FIG. 13) perpendicular to the in-plane direction, and, at the same time, is compressed in the in-plane direction. In this state, a tensile stress "f" acts on the piezoelectric film 5. Therefore, the elastic film 55 is bent and deflected by the tensile stress "f". As the displacement of the piezoelectric film 5 (absolute value) increases in the direction of a minor axis of the cavity 521 in the piezoelectric film 5, the deflected amount of the elastic film 55 increases and an ink drop can be discharged more efficiently.

When the discharge of ink of one time is completed, the piezoelectric element driving circuit stops applying a voltage between the lower electrode 4 and the upper electrode 6. Thereby, the piezoelectric portion 54 returns to the original form shown in FIG. 12, and the volume of the cavity 521 increases. In addition, at this time, the pressure (pressure in the forward direction) from the ink cartridge 631 to the nozzle 511 is acting on ink. For this reason, air is prevented from entering the cavity 521 from the nozzle 511, and a proper amount of ink corresponding to the amount of ink to be discharged can be supplied to the cavity 521 through the reservoir 523 from the ink cartridge 631.

In this way, arbitrary (desired) characters, figures, etc., can be printed by sequentially inputting discharge signals through the piezoelectric element driving circuit to the piezoelectric portion 54 located at a position where the discharge of an ink drop is performed.

2-3. Manufacturing method of Ink-Jet Type Recording Head

Next, an example of a manufacturing method of the ink-jet type recording head 50 according to this embodiment will be described.

First, a base material used as the ink chamber substrate 52, i.e., a substrate 2 comprised of a silicon single crystal substrate with (110) orientation is prepared. Then, as shown in FIG. 1 and the FIGS. 4 to 8, the buffer layer 3, the lower electrode 4, the piezoelectric film 5 and the upper electrode 6 are sequentially formed on the substrate 2. In addition, as described above, the buffer layer 3 formed as above also serves as the elastic film 55.

Then, as shown in FIGS. 12 and 13, the upper electrode 6, the piezoelectric film 5, and the lower electrode 4 are patterned so as to correspond to each cavity 521, and the piezoelectric portions 54 of the number corresponding to the number of the cavity 521 are formed.

Next, the base material (substrate 2) used as the ink chamber substrate 52 is subject to patterning, recesses serving as the cavities 521 are formed at positions corresponding to the piezoelectric portions 54, and recesses serving as the reservoir 523 and the supply ports 524 are formed at predetermined positions.

In this embodiment, since the silicon substrate with (110) orientation is used as the base material (substrate 2), wet etching (anisotropic etching) using high-concentration alkaline aqueous solution can be suitably employed. In the case of wet etching using high-concentration alkaline aqueous solution, it is possible to make the buffer layer 3 serve as an etching stopper as described above. Therefore, the ink chamber substrate 52 can be more easily formed.

By etching the base material (substrate 2) obtained as such in its thickness direction until the elastic film 55 is exposed, the ink chamber substrate 52 is formed. Here, the remaining portion which is not etched serves as side walls 522. The exposed elastic film 55 will be in a state in which the function as an elastic film can be exhibited.

Then, the nozzle plate 51 having a plurality of nozzles 511 therein is positioned and bonded so that each nozzle 511 corresponds to each recess serving as the cavity 521. Thereby, a plurality of cavities 521, a reservoir 523 and a plurality of supply ports 524 are formed. For bonding of the nozzle plate 51, an adhesion method using an adhesive, a fusing method, etc., can be used, for example. Next, the ink chamber substrate 52 is attached to the base 56.

Using the above processes, an ink-jet type recording head 50 according to this embodiment can be manufactured.

2-4. Operation and Advantages

According to the ink-jet type recording head 50 of this embodiment, as described above, the piezoelectric constant ($d_{31}$) of the piezoelectric film 5 of the piezoelectric portion 54 is high, so that the piezoelectric film is deformed more largely due to a voltage applied. That is, the piezoelectric portion 54 has good piezoelectric properties. Thereby, the deflected amount of the elastic film 55 becomes large, so that an ink drop can be more efficiently discharged. Here, "more efficiently" means that it is possible to discharge the same quantity of an ink drop using a fewer voltage. That is, since a drive circuit can be simplified and at the same time, the power consumption can be reduced, it is possible to form the pitch of the nozzle 511 with higher density. Therefore, high-density printing or high-speed printing can be performed. Moreover, since the length of the major axis of the cavity 521 can be shortened, the head can be miniaturized as a whole.

3. Third Embodiment

3-1. Ink-Jet Printer

Figure 14:
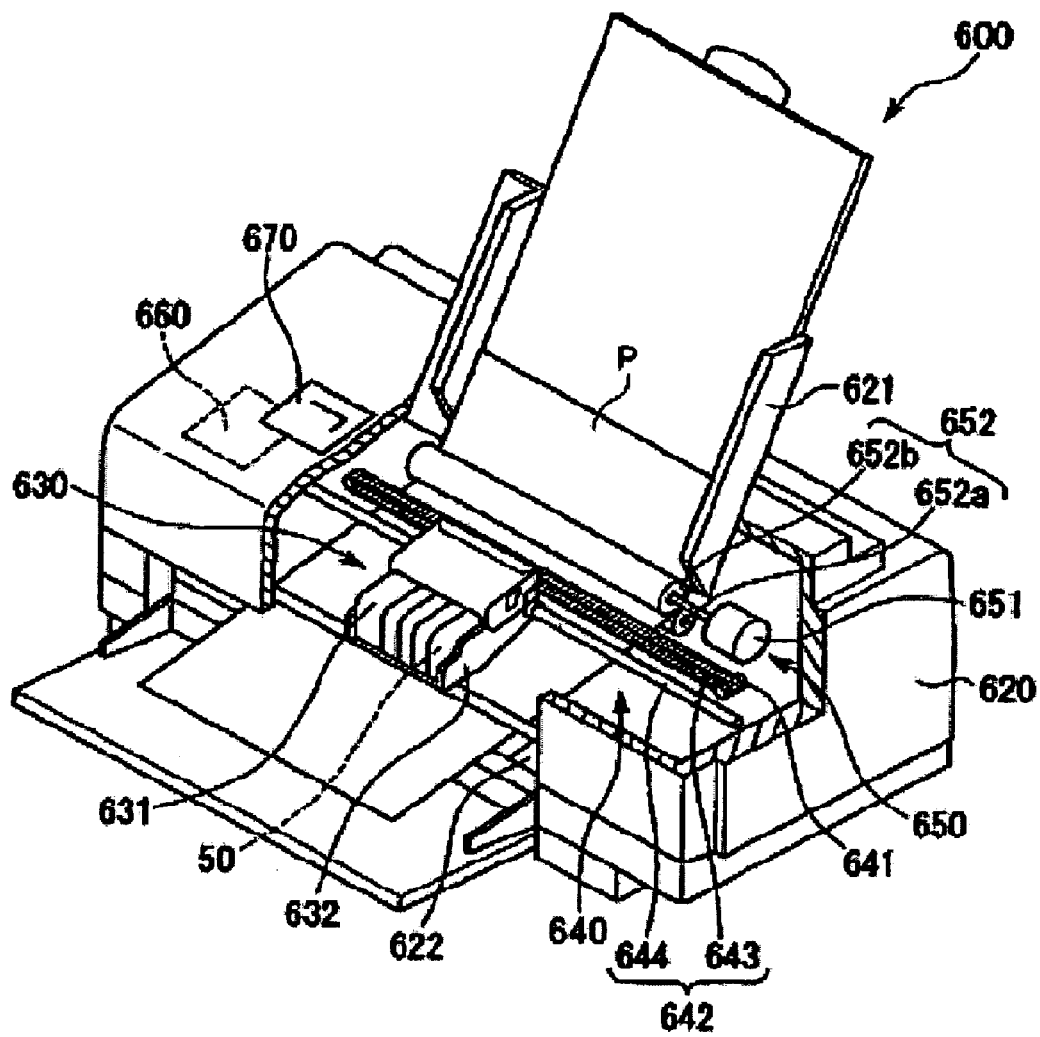
FIG. 14 is a schematic constructional view of an ink-jet printer according to a third embodiment of the present invention.

An ink-jet printer having the ink-jet type recording head 50 according to the second embodiment will be described. FIG. 14 illustrates a schematic structure of an ink-jet printer 600 according to this embodiment. An ink-jet printer 600 can function as a printer capable of printing on a paper, etc. In addition, in the following description, the top in FIG. 14 is called "upper portion", and the bottom is called "lower portion".

An ink-jet printer 600 has a device body 620. A tray 621 on which a recording paper P is placed is disposed on the upper rear side of the ink-jet printer. A discharge port 622 is disposed on the lower front side of the ink-jet printer for discharging the recording paper P. An operation panel 670 is disposed on the top face of the ink-jet printer.

Inside the device body 620, a printing unit 640 having a head unit 630 which performs, mainly, a reciprocating motion, a paper feeding unit 650 which feeds the recording paper P one by one into the printing unit 640, and a control unit 660 which controls the printing unit 640 and the paper feeding unit 650 are provided.

The printing unit 640 includes the head unit 630, a carriage motor 641 which serves as a driving source of the head unit 630, a reciprocating mechanism 642 which receives a rotational force from the carriage motor 641 to reciprocate the head unit 630.

The head unit 630 has arranged thereunder an ink-jet type recording head 50 having the large number of nozzles 511, an ink cartridge 631 which supplies ink to the ink-jet type recording head 50, and a carriage 632 which carries the ink-jet type recording head 50 and the ink cartridge 631.

The reciprocating mechanism 642 has a carriage guide shaft 643 whose both ends are supported by frames (not shown), and a timing belt 644 extending parallel to the carriage guide shaft 643. The carriage 632 is reciprocally supported by the carriage guide shaft 643 and is fixed to a part of the timing belt 644. When the timing belt 644 travels in forward and reverse directions through a pulley by the operation of the carriage motor 641, the head unit 630 is reciprocated while being guided by the carriage guide shaft 643. During the reciprocating motion of the head unit, a suitable amount of ink is discharged from the ink-jet type recording head 50, whereby printing on the recording paper P is performed.

The paper feeding unit 650 has a paper feeding motor 651 serving as a driving source, and a paper feeding roller 652 which rotates by the operation of the paper feeding motor 651. The paper feeding roller 652 has a driven roller 652*a* and a driving roller 652*b*, which are vertically opposed to each other with a feeding path of the recording paper P (or recording paper P itself) sandwiched therebetween. The driving roller 652*b* is connected to the paper feeding motor 651.

3-2. Operation and Advantages

According to the ink-jet printer 600 of this embodiment, since it has the ink-jet type recording head 50 which allows high performance and high density of nozzles, a high-density printing and high-speed printing can be performed.

In addition, the ink-jet printer 600 according to the present invention can also be used as a liquid drop discharge apparatus for industrial use. In this case, as an ink (liquid material) to be discharged, various kinds of functional materials adjusted to a suitable viscosity using a solvent or a dispersion medium can be used.

4. Fourth Embodiment

4-1. Piezoelectric Pump

Figure 15:
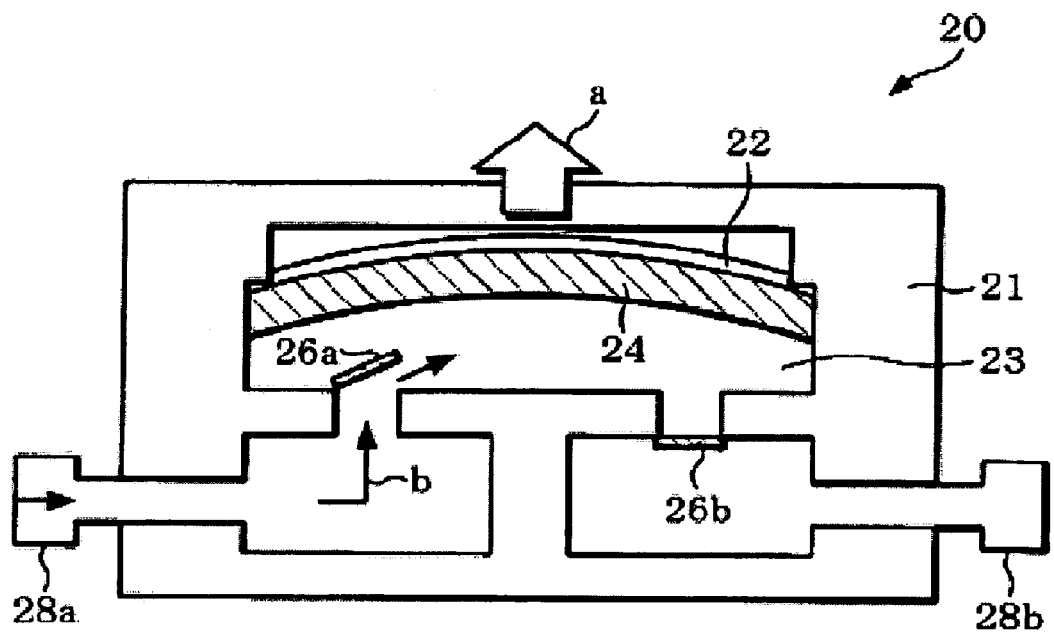
FIG. 15 is a schematic sectional view of a piezoelectric pump according to a fourth embodiment of the present invention.
Figure 16:
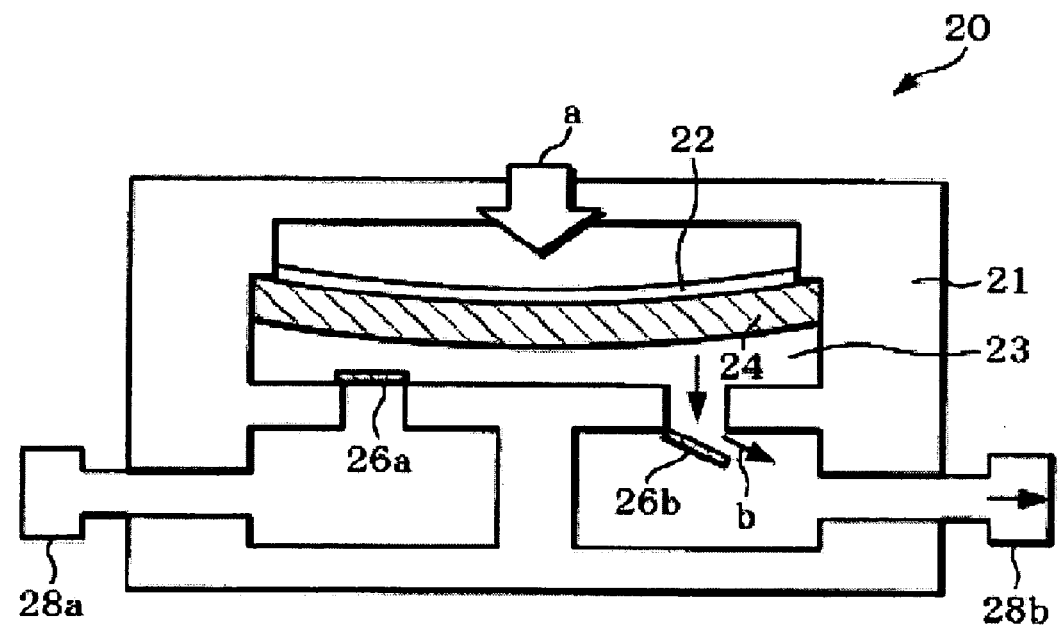
FIG. 16 is a schematic constructional view of the piezoelectric pump according to the fourth embodiment of the present invention.

A piezoelectric pump, as an embodiment, comprising the piezoelectric element 1 according to the first embodiment will be described with reference to the drawings. FIGS. 15 and 16 are schematic sectional views of the piezoelectric pump 20 according to this embodiment. A piezoelectric element of the piezoelectric pump 20 according to this embodiment can function as a piezoelectric actuator. The piezoelectric portion 22 shown in FIGS. 15 and 16 is comprised of the lower electrode 4, the piezoelectric film 5, and the upper electrode 6 of the piezoelectric element 1 shown in FIG. 1, and the buffer layer 3 of the piezoelectric element 1 shown in FIG. 1 serves as a diaphragm 24 shown in FIGS. 15 and 16. Moreover, the substrate 2 (refer to FIG. 1) serves as a base 21 which constitutes the principal part of the piezoelectric pump 20. The piezoelectric pump 20 includes the base 21, the piezoelectric portion 22, a pump chamber 23, a diaphragm 24, an inlet-side check valve 26*a*, a discharge-side check valve 26*b*, an inlet port 28*a*, and a discharge port 28*b*.

4-2. Operation of Piezoelectric Pump

Next, the operation of the above-mentioned piezoelectric pump will be described below. First, when a voltage is supplied to the piezoelectric portion 22, the voltage is applied to the piezoelectric film 5 in its thickness direction (refer to FIG. 1). Then, as shown in FIG. 15, the piezoelectric portion 22 is deflected in the direction (the direction of the arrow "a" shown in FIG. 15) in which the volume of the pump chamber 23 is widen. Moreover, the diaphragm 24 is also deflected, with the piezoelectric portion 22, in the direction in which the volume of the pump chamber 23 increases. As a result, the pressure in the pump chamber 23 changes and fluid flows into the pump chamber 23 from the inlet port 28*a* by the check valve 26*a* and 26*b* (the direction of the arrow "b" shown in FIG. 15).

Next, when the supply of a voltage to the piezoelectric portion 22 stops, the application of a voltage to the piezoelectric film 5 in its thickness direction also stops (refer to FIG. 1). Then, as shown in FIG. 16, the piezoelectric portion 22 is deflected in the direction (the direction of the arrow "a" shown in FIG. 16) in which the volume of the pump chamber 23 decreases. At the same time, the diaphragm 24 is also deflected along with the piezoelectric portion 22 in the direction in which the volume of the pump chamber 23 decreases. As a result, the pressure in the pump chamber 23 changes and fluid is discharged to the outside from the discharge port 28*b* by the action of the check valves 26*a* and 26*b* (the direction of the arrow "b" shown in FIG. 16).

The piezoelectric pump 20 can be used as a water-cooling module for electronic apparatuses, for example, personal computers, and desirably notebook computers. A water-cooling module uses the above-mentioned piezoelectric pump 20 for driving cooling liquid and includes the piezoelectric pump 20 and circulating water channels, etc.

4-3. Operation and Advantages

According to the piezoelectric pump 20 according to this embodiment, as described above, since the piezoelectric film 5 of the piezoelectric portion 22 has good piezoelectric properties, suction and discharge of fluid can be efficiently performed. Therefore, the piezoelectric pump 20 according to this embodiment can have a large discharge pressure and discharge amount. Further, the high-speed operation of the piezoelectric pump 20 becomes possible. Moreover, the piezoelectric pump 20 can be manufactured in compact size as a whole.

5. Fifth Embodiment
5-1. Surface-Acoustic-Wave Element

Figure 17:
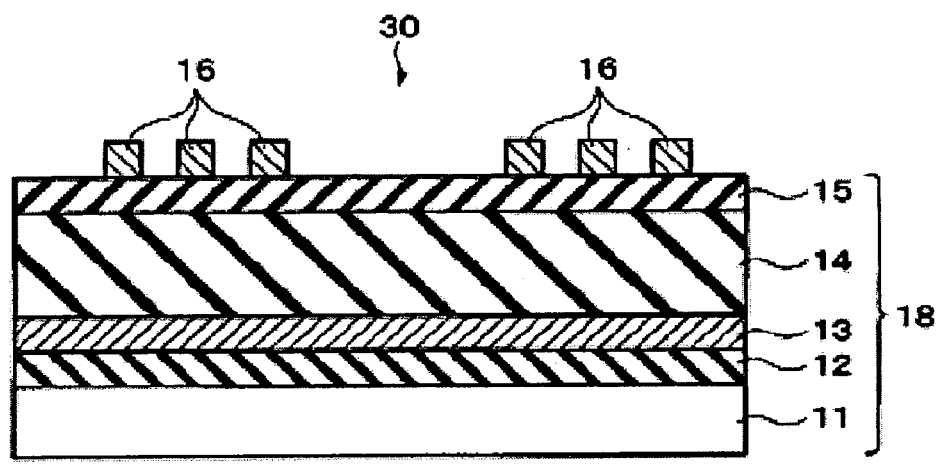
FIG. 17 is a sectional side view of a surface-acoustic-wave element according to a fifth embodiment of the present invention.

Next, an example of a surface-acoustic-wave element according to the fifth embodiment of the present invention will be described referring to the accompanying drawings. A surface-acoustic-wave element 30 according to this embodiment includes a substrate 11, a buffer layer 12, a conductive layer 13, a piezoelectric film 14, a protective layer 15, and an electrode 16, as shown in FIG. 17. The substrate 11, the buffer layer 12, the conductive film 13, the piezoelectric film 14, and the protective layer 15 constitute the base 18.

As the substrate 11, a single crystal silicon (100) substrate can be used, for example. The buffer layer 12 can be comprised of the buffer layer 3 of the piezoelectric element 1 shown in FIG. 1. The conductive film 13 can be comprised of the lower electrode 4 of the piezoelectric element 1 shown in FIG. 1. The piezoelectric film 14 can be comprised of the piezoelectric film 5 of the piezoelectric element 1 shown in FIG. 1. The protective layer 15, for example, can be comprised of an oxide or a nitride, etc. As the electrode 16, thin film such as aluminum can be used, for example. The electrode 16 is an inter-digital type electrode (inter-digital transducer: hereinafter, referred to as "IDT electrode"). When the electrode 16 is observed from the upper side, it has shapes, for example, like inter-digital type electrodes 141, 142, 151, 152, and 153 shown in FIGS. 18 and 19.

5-2. Operation and Advantages

According to the surface-acoustic-wave element 30 of this embodiment, since the piezoelectric film 14 comprised of the piezoelectric film 5 of the piezoelectric element 1 shown in FIG. 1 has good piezoelectric properties, the surface-acoustic-wave element 30 also has high performance characteristic.

6. Sixth Embodiment
6-1. Frequency Filter

Figure 18:
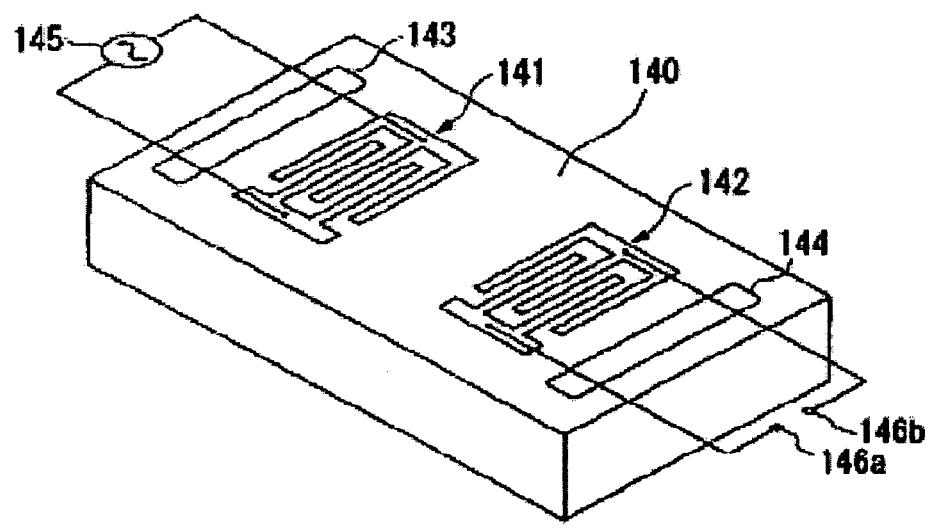
FIG. 18 is a perspective view of a frequency filter according to a sixth embodiment of the present invention.

Next, an example of a frequency filter according to the sixth embodiment of the present invention will be described referring to the accompanying drawings. FIG. 18 schematically illustrates the frequency filter according to this embodiment.

As shown in FIG. 18, the frequency filter has a base 140. As the base 140, the base 18 of the surface-acoustic-wave element 30 shown in FIG. 17 can be used.

The IDT electrodes 141 and 142 are formed on the top face of the base 140. Moreover, sound absorption units 143 and 144 are formed on the base 140 in such a manner that the IDT electrodes 141 and 142 can be disposed therebetween. The sound absorption units 143 and 144 absorb the surface acoustic wave which is propagated on the surface of the base 140. A high frequency signal source 145 is connected to the IDT electrode 141 formed on the base 140, and the signal line is connected to the IDT electrode 142.

6-2. Operation of Frequency Filter

Next, the operation of the above-mentioned frequency filter will be described. In the above-mentioned construction, when a high frequency signal is output from the high frequency signal source 145, the high frequency signal is input to the IDT electrode 141, thereby generating surface acoustic waves on the top surface of the base 140. The surface acoustic waves are propagated from the IDT electrode 141 to the sound absorption unit 143 and are absorbed by the sound absorption unit 143. However, among the surface acoustic waves propagated toward the IDT electrode 142, the surface acoustic waves with a specific frequency which is set according to the pitch of the IDT electrode 142, etc., or with a frequency belonging to a specific band is converted into electric signals, and the converted electrical signal are taken out to terminals 146a and 146b through a signal line. In addition, the sound absorption unit 144 through the IDT electrode 142 absorbs most of frequency components other than the above-mentioned specific frequency and the frequency belonging to a specific band. Thus, it is possible to select (filter) only surface acoustic waves with a specific frequency or with a frequency belonging to a specific band among the electric signals supplied to the IDT electrode 141 having the frequency filter according to this embodiment.

7. Seventh Embodiment
7-1. Oscillator

Figure 19:
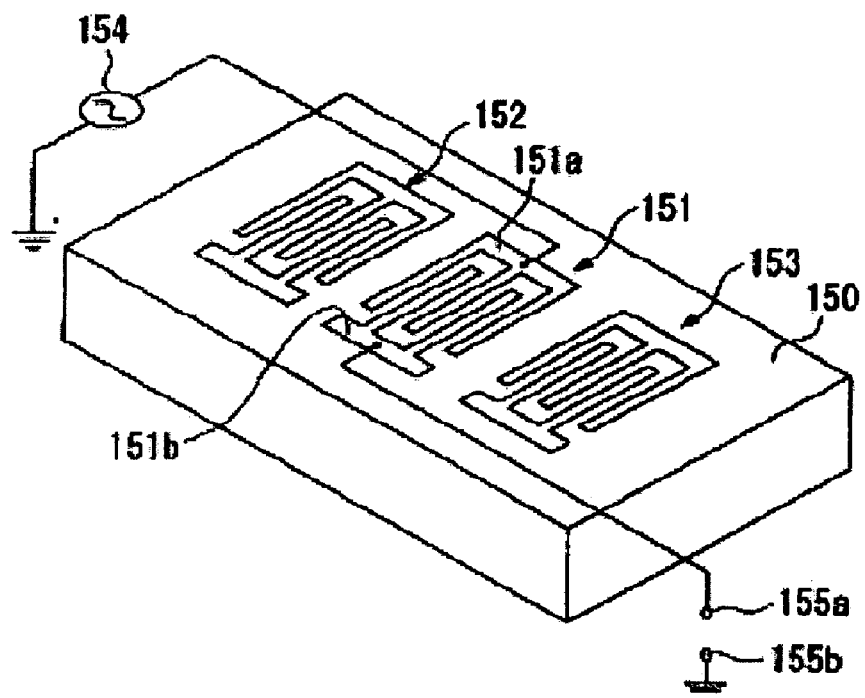
FIG. 19 is a perspective view of an oscillator according to a seventh embodiment of the present invention.

Next, an example of an oscillator according to the seventh embodiment of the present invention will be described with reference to the accompanying drawings. FIG. 19 schematically illustrates an oscillator according to this embodiment.

As shown in FIG. 19, the oscillator has a base 150. As the base 18, the surface-acoustic-wave element 30 shown in FIG. 17 can be used, similar to the above-mentioned frequency filter.

The IDT electrode 151 is formed on the top face of the base 150, and IDT electrodes 152 and 153 are also formed such that the IDT electrode 151 can be disposed therebetween. A high frequency signal source 154 is connected to one comb-shaped electrode 151a, and the signal line is connected to the other comb-shaped electrode 151b. Both of the comb-shaped electrodes constitute the IDT electrode 151. In addition, the IDT electrode 151 is equivalent to an electric signal applying electrode, and the IDT electrodes 152 and 153 are respectively equivalent to a resonating electrode which resonates with the specific frequency component of the surface elastic wave generated by the IDT electrode 151, or the frequency component belonging to a specific band.

7-2. Operation of Oscillator

Hereinafter, the operation of the above-mentioned oscillator is will described. According to the above-mentioned construction, when a high frequency signal is output from the high frequency signal source 154, the high frequency signal is applied to one comb-shaped electrode 151a of the IDT electrode 151, and thereby, on the surface of the base 150, a surface acoustic wave propagating toward the IDT electrode 152 and a surface acoustic wave propagating toward the IDT electrode 153 are generated. Among these surface acoustic waves, the surface acoustic wave with a specific frequency component is reflected by the IDT electrodes 152 and 153, and thereby, a stationary war is generated between the IDT electrodes 152 and 153. When the surface acoustic wave with a specific frequency component or a frequency component belonging to a specific band is repeatedly reflected by the IDT electrodes 152 and 153, the specific frequency component or the frequency component belonging to a specific band resonates, and its amplitude increases. A part of surface acoustic wave with the specific frequency component or the frequency component belonging to a specific band is taken out from the comb-shaped electrode 151b of the IDT electrode 151, and the electric signal of the frequency (or frequency which has a certain amount of zone) according to the resonant frequency of the IDT electrodes 152 and 153 can be taken out to the terminals 155a and 155b.

7-3. SAW Oscillator for Voltage Control

Figure 20:
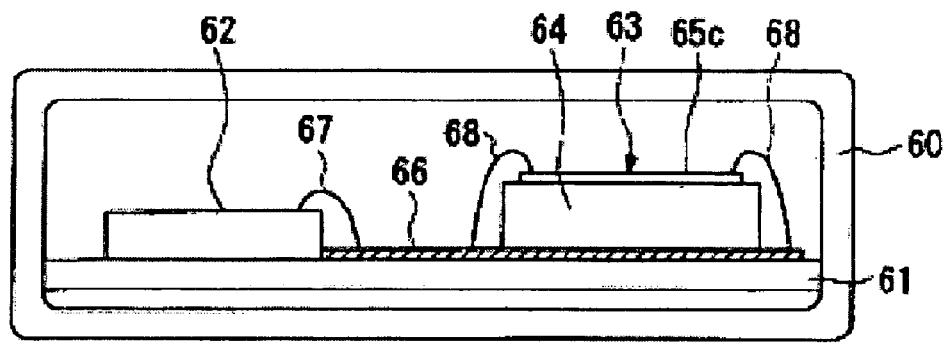
FIG. 20 is a schematic diagram of an example in which the oscillator according to the seventh embodiment of the present invention is applied to VCSO.
Figure 21:
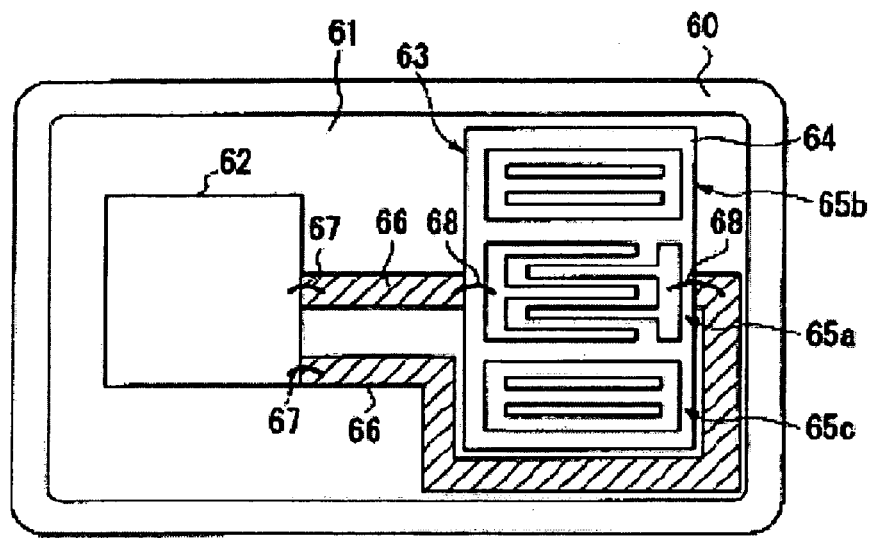
FIG. 21 is a schematic diagram of an example in which the oscillator according to the seventh embodiment of the present invention is applied to VCSO.

FIGS. 20 and 21 schematically illustrate an example where the above-mentioned oscillator is applied to VCSO (Voltage Controlled SAW Oscillator), and FIG. 20 is a side perspective view and FIG. 21 is a perspective view as seen from the upper side.

VCSO is mounted inside a metallic (Al or stainless steel) housing 60, and it is comprised of. On a substrate 61, IC (Integrated Circuit) 62 and oscillator 63 are mounted. In this case, IC 62 is an oscillating circuit for controlling the frequency applied to the oscillator 63 according to the voltage value input from an external circuit (not shown).

The oscillator 63 includes a base 64, and IDT electrodes 65a to 65c respectively formed on the base 64, in almost the same manner as that of the oscillator 63 shown in FIG. 19. As the base 64, the base 18 of the surface-acoustic-wave element 30 shown in FIG. 17 can be used, similar to the above-mentioned oscillator shown in FIG. 19.

On the substrate 61, wiring 66 for electrically connecting the IC 62 and the oscillator 63 is patterned. The IC 62 and the wiring 66 are connected by wire lines 67 such as a gold wire, etc., and the oscillator 63 and the wiring 66 are connected by wire lines 68 such as a gold wire. Thereby, the IC 62 and the oscillator 63 are electrically connected to each other through the wiring 66.

Figure 22:
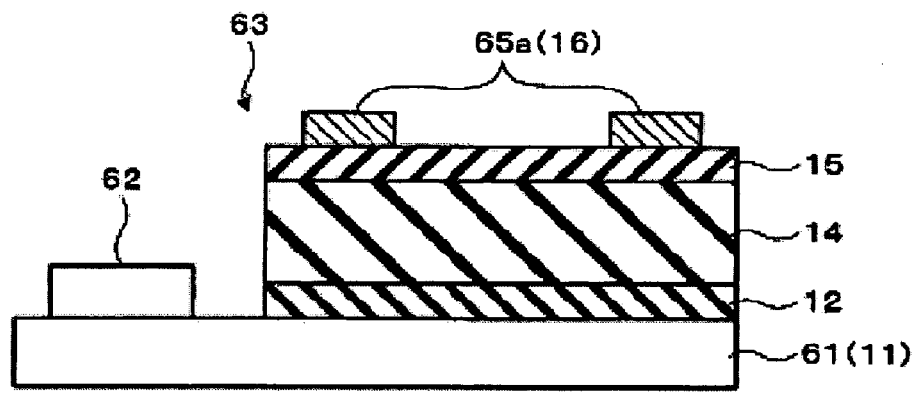
FIG. 22 is a schematic diagram of an example in which the oscillator according to the seventh embodiment of the present invention is applied to VCSO.

In addition, VCSO can also be formed by integrating the IC 62 and the oscillator 63 on the same substrate. FIG. 22 schematically illustrates a VCSO where the IC 62 and the oscillator 63 are integrated on the same substrate 61. In addition, in FIG. 22, the oscillator 63 has the same structure as the surface-acoustic-wave element 30 shown in FIG. 17, except that the electric conduction layer 13 is omitted therefrom.

As shown in FIG. 22, VCSO is formed so that the IC 62 and the oscillator 63 share the substrate 61. As the substrate 61, for example, the substrate 11 of the surface-acoustic-wave element 30 shown in FIG. 17 can be used. The IC 62 and the electrode 65a of the oscillator 63 are electrically connected to each other, although not shown. As the electrode 65a, for example, the electrode 16 of the surface-acoustic-wave element 30 shown in FIG. 17 can be used. As a transistor constituting the IC 62, thin film transistors (TFTs) are employable.

Figure 23:
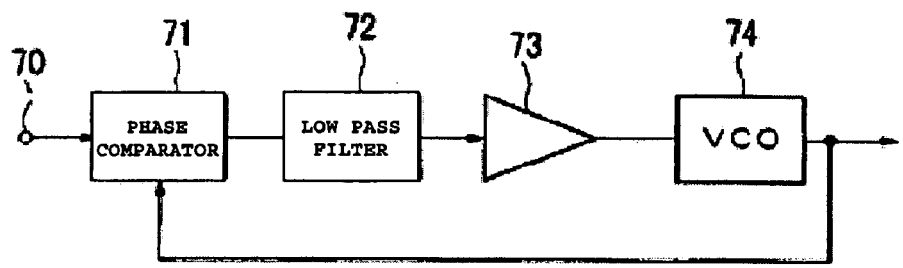
FIG. 23 is a block diagram showing a basic construction of a PLL circuit.

VCSO shown in FIGS. 20 to 22 can be used as a voltage controlled oscillator (VCO) for a PLL circuit shown in FIG. 23. Hereinafter, the PLL circuit will be described in brief.

FIG. 23 is a block diagram showing the basic construction of a PLL circuit. The PLL circuit includes a phase comparator 71, a low pass filter 72, an amplifier 73, and a VCO 74. The phase comparator 71 compares the phase (or frequency) of the signal input from the input terminal 70 with the phase (or frequency) of the signal output from VCO 74, and then generates an error voltage signal where a value corresponding to the difference is set. The low pass filter 72 is designed to pass only low frequency components contained in the error voltage signal output from the phase comparator 71. The amplifier 73 amplifies the signal output from the low-pass filter 72. VCO 74 is an oscillating circuit where the frequency oscillation according to the input voltage value continuously changes in a certain range.

A PLL circuit with this construction operates such that the difference of the phase (or frequency) input from the input terminal 70 and the phase (or frequency) of the signal output from VCO 74 can decrease, and synchronizes the frequency of the signal output from VCO 74 with the frequency of the signal input from the input terminal 70. Once the frequency of the signal output from VCO 74 is synchronized with the frequency of the signal input from the input terminal 70, except a predetermined phase difference, a signal which coincides with the signal input from the input terminal 70 and which follows change of the input signal is output.

8. Eighth Embodiment

Figure 24:
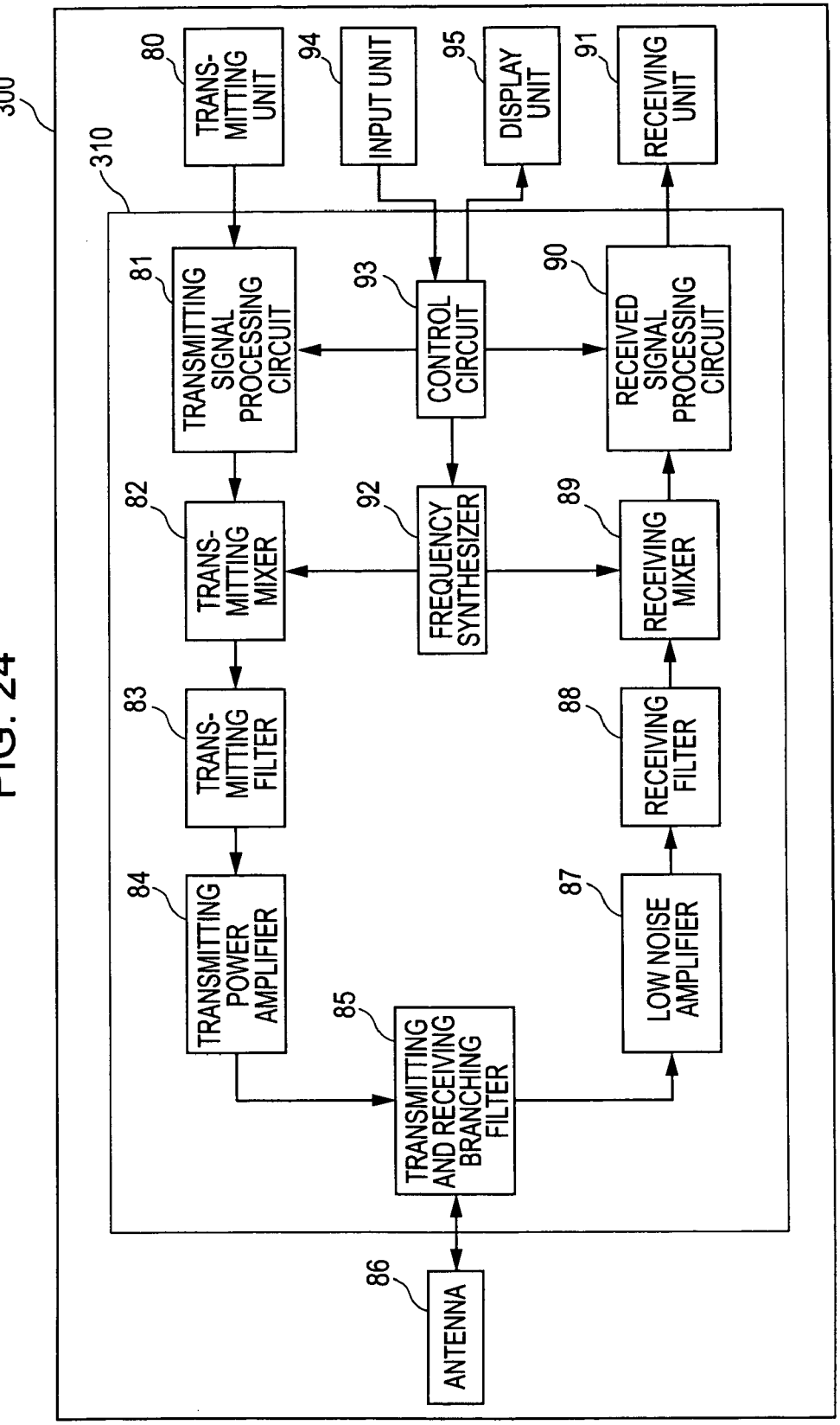
FIG. 24 is a block diagram showing the construction of an electronic circuit according to an eighth embodiment of the present invention.

Next, an example of a electronic circuit and an electronic apparatus according to the eighth embodiment of this invention will be described, referring to the accompanying drawings. FIG. 24 is a block diagram showing the electrical configuration of an electronic apparatus 300 according to an example of this embodiment. As an electronic apparatus 300, a portable telephone can be exemplified.

The electronic apparatus 300 has an electronic circuit 310, a transmitting unit 80, a receiving unit 91, an input unit 94, a display unit 95, and an antenna 86. The electronic circuit 310 has a transmitting signal processing circuit 81, a transmitting mixer 82, a transmitting filter 83, a transmitting power amplifier 84, a transmitting and receiving branching filter 85, a low noise amplifier 87, a receiving filter 88, a receiving mixer 89, a received signal processing circuit 90, a frequency synthesizer 92, and a control circuit 93.

In the electronic circuit 310, the frequency filter shown in FIG. 18 can be used as the transmitting filter 83 and a receiving filter 88. The frequency (frequency to pass) to be filtered is individually set in the transmitting filter 83 and the receiving filter 88, according to the frequency in need among the signals output from the transmitting mixer 82, and the frequency needed by the receiving mixer 89. Further, as the VCO 74 of the PLL circuit (refer to FIG. 23) provided in the frequency synthesizer 92, the oscillator shown in FIG. 19 or VCSO shown in FIGS. 20 to 22 can be used.

The transmitting unit 80 can be implemented as, for example, a microphone which converts a sound wave signal into an electric signal. The transmitting signal processing circuit 81 is a circuit which performs, for example, D/A conversion processing, modulation processing, etc., on the electric signal output from the transmitting unit 80. The transmitting mixer 82 mixes the signal output from the transmitting signal processing circuit 81 using the signal output from the frequency synthesizer 92. The transmitting filter 83 passes only the signal in need with an intermediate frequency for which intermediate frequency (hereinafter, referred to as "IF"), and cuts the signal with a frequency not needed. The signal output from the transmitting filter 83 is converted into an RF signal by a converter circuit (not shown). The transmitting power amplifier 84 amplifies the electric power of the RF signal output from the transmitting filter 83, and outputs it to the transmitting and receiving branching filter 85.

The transmitting and receiving branching filter 85 outputs RF signal output from the transmitting power amplifier 84 to the antenna 86, and transmits it in the form of an electric wave from the antenna 86. Moreover, the transmitting and receiving branching filter 85 branches the signal received by the antenna 86, and outputs it to the low noise amplifier 87. The low noise amplifier 87 amplifies the signal received from the transmitting and receiving branching filter 85. The signal output from the low noise amplifier 87 is converted into IF by a converter circuit (not shown).

The receiving filter 88 passes only the signal with a frequency in need for IF converted by a converter circuit (not shown), and cuts the signal with a frequency not needed. The receiving mixer 89 mixes the signals output from the receiving filter 88, using the signal output from the frequency synthesizer 92. The received signal processing circuit 90 processes the signal output from the receiving mixer 89, for example, A/D conversion processing, demodulation processing, etc. The receiving unit 91 can be implemented as, for example, a compact speaker which converted an electric signal into a sound wave.

The frequency synthesizer 92 is a circuit for generating the signal to be supplied to the transmitting mixer 82, and the signal to be supplied to the receiving mixer 89. The frequency synthesizer 92 has a PLL circuit and can generate a new signal by dividing the signal output from the PLL circuit. The control circuit 93 controls the transmitting signal processing circuit 81, the received signal processing circuit 90, the frequency synthesizer 92, the input unit 94, and the display unit 95. The display unit 95 displays the state of a device for who uses the device, for example, a portable telephone. The input unit 94 is for inputting, for example, indications from the user of a portable telephone.

In addition, although, in the above description, a portable telephone is exemplified as an electronic apparatus and an electronic circuit provided in a portable telephone is exemplified as an electronic circuit, this invention is not limited thereto, and can be applied to various mobile communication apparatus and electronic circuits provided therein.

Moreover, it can be applied not only to mobile communications apparatus but also to the communication apparatus used in a state of deferment of the tuner which receives BS and CS broadcasting and electronic circuits provided therein. Furthermore, communication carrier is not only limited to the communication apparatus using electric waves which propagates in the air, but also can be applied to an electronic apparatus such as HUB using a high frequency signal which propagates through a coaxial cable or an optical cable, or an optical signal which propagates through an optical cable, and to an electronic circuit provided therein.

9. Ninth Embodiment

Next, an example of a thin-film piezoelectric resonator according to a ninth embodiment to which the present invention is applied will be described referring to a drawing.

9-1. First Thin-Film Piezoelectric Resonator

Figure 25:
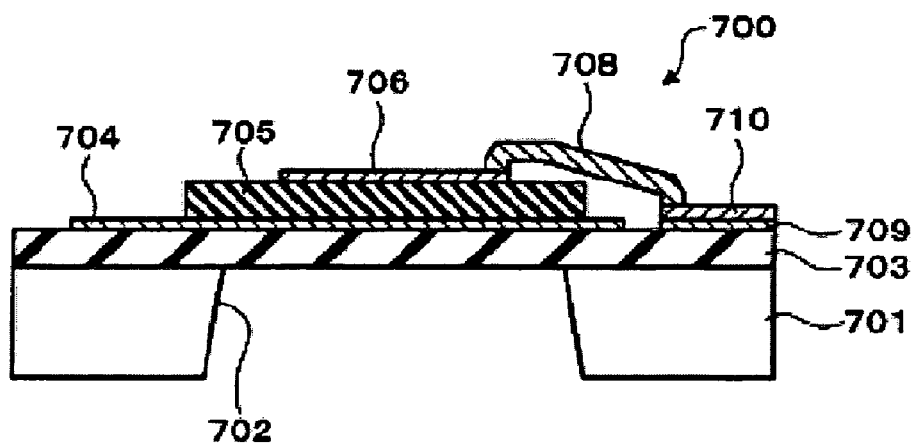
FIG. 25 is a sectional side view illustrating a thin-film piezoelectric resonator according to a ninth embodiment of the present invention.

FIG. 25 schematically illustrates a first thin-film piezoelectric resonator 700 as an example of this embodiment. The first thin-film piezoelectric resonator 700 is a diaphragm-type thin-film piezoelectric resonator.

The first thin-film piezoelectric resonator 700 includes a substrate 701, an elastic film 703, a lower electrode 704, a piezoelectric film 705, and an upper electrode 706. The substrate 701, the elastic film 703, the lower electrode 704, the piezoelectric film 705 and the upper electrode 706 of the thin-film piezoelectric resonator 700 are respectively equivalent to the substrate 2, the buffer layer 3, the lower electrode 4, the piezoelectric film 5 and the upper electrode 6 of the piezoelectric element 1 shown in FIG. 1. That is, the first thin-film piezoelectric resonator 700 has the piezoelectric element 1 shown in FIG. 1.

A via hole 702 which penetrates a substrate 701 is provided in the substrate 701. Wiring 708 is formed on the upper electrode 706. The wiring 708 is electrically connected to an electrode 709 formed on the elastic film 703 with the pad 710 interposed therebetween.

9-2. Operation and Advantages

According to the first thin-film piezoelectric resonator 700 of this embodiment, it has a high electromechanical coupling coefficient since the piezoelectric film 705 has good piezoelectric properties. Therefore, it is possible to use the thin-film piezoelectric resonator 700 in a high frequency domain. Further, the thin-film piezoelectric resonator 700 can be miniaturized (made thin) and can be satisfactorily operated.

9-3. Second Thin-Film Piezoelectric Resonator

Figure 26:
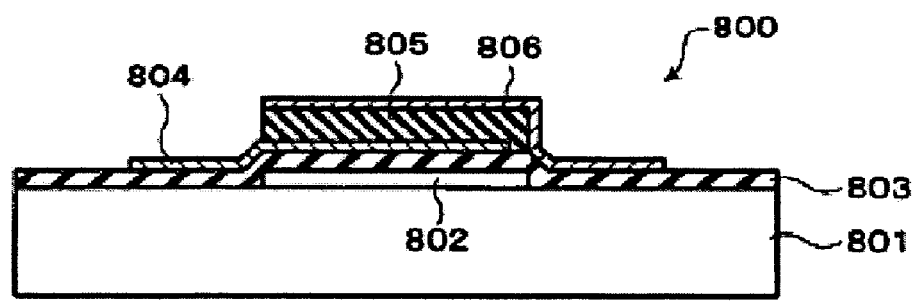
FIG. 26 is a sectional side view illustrating the thin-film piezoelectric resonator according to the ninth embodiment of the present invention.

FIG. 26 schematically illustrates a second thin-film piezoelectric resonator 800 as an example of this embodiment. The second thin-film piezoelectric resonator 800 is mainly different from the first thin-film piezoelectric resonator 700 shown in FIG. 25 in that any via hole is not formed, but an air gap 802 is formed between a substrate 801 and an elastic film 803 instead.

The second thin-film piezoelectric resonator 800 includes a substrate 801, an elastic film 803, a lower electrode 804, a piezoelectric film 805, and an upper electrode 806. The substrate 801, the elastic film 803, the lower electrode 804, the piezoelectric film 805 and the upper electrode 806 of the thin-film piezoelectric resonator 800 are respectively equivalent to the substrate 2, the buffer layer 3, the lower electrode 4, the piezoelectric film 5 and the upper electrode 6 of the piezoelectric element 1 shown in FIG. 1. That is, the second thin-film piezoelectric resonator 800 has the piezoelectric element 1 shown in FIG. 1. The air gap 802 is a space formed between the substrate 801 and the elastic film 803.

9-4. Operations and Advantages

According to the second thin-film piezoelectric resonator 800 according to this embodiment, it has a high electromechanical coupling coefficient since the piezoelectric film 805 has good piezoelectric properties. Therefore, it is possible to use the thin-film piezoelectric resonator 800 in a high frequency domain. Further, the thin-film piezoelectric resonator 800 can be miniaturized (made thin) and can be satisfactorily operated.

9-5. Applications

The piezoelectric thin film resonator according to this embodiment (for example, the first thin-film piezoelectric resonator 700 and the second thin-film piezoelectric resonator 800) can function as a resonator, a frequency filter or an oscillator. Also, for example, the piezoelectric thin film resonator according to this embodiment which functions as a frequency filter can be used as a transmitting filter 83 and a receiving filter 88 of the electronic circuit 310 shown in FIG. 24. Further, the piezoelectric thin film resonator according to this embodiment which functions as an oscillator can be used as an oscillator of a frequency synthesizer 92.

As described above, the embodiments according to the present invention have been described hitherto. In detail, but it could be easily understood for an ordinary skilled person in this art that a large number of modification can be made without substantially deviating from the new matter and advantages disclosed by this invention. Therefore, such all modifications shall be construed to be included in the scope of the present invention. For example, the piezoelectric element according to the present invention is not only applied to devices mentioned above, but also is applicable to various devices.

What is claimed is:

1. A piezoelectric film represented by the following general formula:

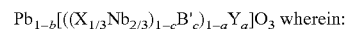

$Pb_{1-b}[((X_{1/3}Nb_{2/3})_{1-c}B'_c)_{1-a}Y_a]O_3$ wherein:

X is at least one of Mg, Zn and Ni;

B' is at least one of Zr, Ti and Hf;

Y is at least one of V, Nb, Ta, Cr, Mo and W;

a satisfies $0.05 \leq a < 0.30$;

b satisfies $0.025 \leq b \leq 0.15$;
when X is Mg, c satisfies $0.25 \leq c \leq 0.35$;
when X is Ni, c satisfies $0.30 \leq c \leq 0.40$; and
when X is Zn, c satisfies $0.05 \leq c \leq 0.15$.

2. The piezoelectric film according to claim 1, wherein the Pb is partially substituted with at least one element whose valence is higher than that of Pb.

3. The piezoelectric film according to claim 2, wherein the at least one element whose valence is higher than that of Pb is selected from the group consisting of lanthanoids.

4. The piezoelectric film according to claim 1, wherein the piezoelectric film has a rhombo-hedral structure and has (100) orientation in a pseudo-cubic crystal system.

5. The piezoelectric film according to claim 1, wherein:
Y is at least one of V, Nb and Ta; and
the deficient amount b of Pb is almost half of the amount a of Y.

6. The piezoelectric film according to claim 1, wherein:
Y is at least one of Cr, Mo and W; and
the deficient amount b of Pb is almost the same as the amount a of Y.

7. The piezoelectric film according to claim 1, wherein:
Y includes Y1 and Y2;
the composition ratio of Y1 and Y2 is represented by (a−e):e;
Y1 is at least one of V, Nb and Ta;
Y2 is at least one of Cr, Mo and W; and
the deficient amount b of Pb is almost the same as the total amount of (a−e)/2, which is a half of the amount of Y1, and the amount e of Y2.

8. The piezoelectric film according to claim 1, wherein Y is present at B sites of a perovskite-type structure.

9. The piezoelectric film according to claim 1, wherein B' is Ti.

10. The piezoelectric film according to claim 1, wherein:
in B', the composition ratio of at least one of Zr and Hf to Ti is represented by (1−p):p; and
p satisfies $0.6 \leq p$.

11. A piezoelectric element comprising the piezoelectric film according to claim 1.

12. The piezoelectric element according to claim 11, the element further comprising:
a lower electrode formed on a substrate, the piezoelectric film being formed on the lower electrode; and
an upper electrode formed on the piezoelectric film.

13. The piezoelectric element according to claim 12, wherein the lower electrode has (100) orientation in a pseudo-cubic crystal system by epitaxial growth.

14. The piezoelectric element according to claim 12, wherein the lower electrode is at least one of $SrRuO_3$, $Nb—SrTiO_3$, $La—SrTiO_3$, and $(La, Sr)CoO_3$.

15. The piezoelectric element according to claim 11, the element further comprising:
a buffer layer formed on the substrate by an ion-beam assisted method;
a lower electrode of a perovskite structure formed on the buffer layer, the piezoelectric film being formed on the lower electrode; and
an upper electrode formed on the piezoelectric film.

16. A piezoelectric actuator comprising the piezoelectric element according to claim 11.

17. A piezoelectric pump comprising the piezoelectric element according to claim 11.

18. An ink-jet type recording head comprising the piezoelectric element according to claim 11.

19. An ink-jet printer comprising the ink-jet type recording head according to claim 18.

20. A surface-acoustic-wave element comprising the piezoelectric element according to claim 11.

21. A thin-film piezoelectric resonator comprising the piezoelectric element according to claim 11.

* * * * *